(12) United States Patent
Lamotte et al.

(10) Patent No.: US 6,638,680 B2
(45) Date of Patent: Oct. 28, 2003

(54) MATERIAL AND METHOD FOR MAKING AN ELECTROCONDUCTIVE PATTERN

(75) Inventors: Johan Lamotte, Rotselaar (BE); Frank Louwet, Diepenbeek (BE); Marc Van Damme, Mechelen (BE); Joan Vermeersch, Deinze (BE)

(73) Assignee: Agfa-Gevaert (BE)

( * ) Notice: Subject to any disclaimer, the term of this patent is extended or adjusted under 35 U.S.C. 154(b) by 107 days.

(21) Appl. No.: 09/891,649

(22) Filed: Jun. 26, 2001

(65) Prior Publication Data

US 2002/0022191 A1 Feb. 21, 2002

Related U.S. Application Data

(60) Provisional application No. 60/214,415, filed on Jun. 28, 2000.

(30) Foreign Application Priority Data

Jun. 26, 2000 (EP) ............................................ 00202216

(51) Int. Cl.$^7$ ......................... G03F 7/021; G03F 7/023; G03F 7/30
(52) U.S. Cl. ....................... 430/160; 430/165; 430/166; 430/188; 430/192; 430/193; 430/326; 430/270.1
(58) Field of Search ............................. 430/270.1, 188, 430/166, 165, 191, 192, 193, 326, 160

(56) References Cited

U.S. PATENT DOCUMENTS

| | | | |
|---|---|---|---|
| 5,137,799 A | | 8/1992 | Kaempf et al. |
| 5,312,681 A | * | 5/1994 | Muys et al. ................. 428/323 |
| 5,354,613 A | * | 10/1994 | Quintens et al. ............. 428/341 |
| 5,370,981 A | * | 12/1994 | Krafft et al. ................. 430/529 |
| 5,372,924 A | * | 12/1994 | Quintens et al. ............. 430/527 |
| 5,391,472 A | * | 2/1995 | Muys et al. ................. 430/527 |
| 5,561,030 A | | 10/1996 | Holdcroft et al. |
| 5,721,091 A | | 2/1998 | Watanabe et al. |
| 6,300,049 B2 | * | 10/2001 | Eichorst et al. ............. 430/529 |

FOREIGN PATENT DOCUMENTS

| | | |
|---|---|---|
| EP | 0 338 786 A2 | 10/1989 |
| EP | 0 413 559 A2 | 2/1991 |
| EP | 0 540 448 A1 | 5/1993 |
| EP | 0 614 123 A1 | 9/1994 |

OTHER PUBLICATIONS

Angelopoulos et al.; "Water Soluble Conducting Polyanilines: Applications in Lithography," *Journal of Vacuum Science and Technology*, 11 (6), 2794–2797 (Nov./Dec. 1993).

Lerch et al.; "Properties and Applications of Baytron (PEDT)," *J. Chem. Phys*, 95, 1506–1509 (1998).

Search report for EP 00 20 2216, Nov. 30, 2000.

* cited by examiner

*Primary Examiner*—John S. Chu
(74) *Attorney, Agent, or Firm*—Leydig, Voit & Mayer, Ltd.

(57) ABSTRACT

A material for making an electroconductive pattern, the material comprising a support and a light-exposure differentiable element, characterized in that the light-exposure differentiable element comprises an outermost layer containing a polyanion and a polymer or copolymer of a substituted or unsubstituted thiophene, and optionally a second layer contiguous with the outermost layer; and wherein the outermost layer and/or the optional second layer contains a light-sensitive component capable upon exposure of changing the removability of the exposed parts of the outermost layer relative to the unexposed parts of the outermost layer; and a method of making an electroconductive pattern on a support using the material for making an electroconductive pattern.

19 Claims, No Drawings

MATERIAL AND METHOD FOR MAKING AN ELECTROCONDUCTIVE PATTERN

The application claims the benefit of U.S. Provisional Application No. 60/214,415 filed Jun. 28, 2000.

FIELD OF THE INVENTION

The present invention relates to a material and a method for making an electroconductive pattern.

BACKGROUND OF THE INVENTION

For the fabrication of flexible LC displays, electroluminescent devices and photovoltaic cells transparent ITO (indium-tin oxide) electrodes are used. These electrodes are made by vacuum sputtering of ITO onto a substrate. This method involves high temperatures, up to 250° C., and therefore glass substrates are generally used. The range of potential applications is limited, because of the high fabrication costs, the low flexibility (pliability) and stretchability as a consequence of the brittleness of the ITO layer and the glass substrate. Therefore the interest is growing in all-organic devices, comprising plastic resins as a substrate and organic electroconductive polymer layers as electrodes. Such plastic electronics allow the realization of low cost devices with new properties (Physics World, March 1999, p.25–39). Flexible plastic substrates can be provided with an electroconductive polymer layer by continuous roller coating methods (compared to batch process such as sputtering) and the resulting organic electrodes enable the fabrication of electronic devices characterised by a higher flexibility and a lower weight.

The production and the use of electroconductive polymers such as polypyrrole, polyaniline, polyacetylene, polyparaphenylene, polythiophene, polyphenylenevinylene, polythienylenevinylene and polyphenylenesulphide are known in the art.

EP-A 440 957 discloses dispersions of polythiophenes, constructed from structural units of formula (I):

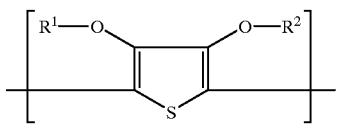

in which $R^1$ and $R^2$ independently of one another represent hydrogen or a $C_{1-4}$-alkyl group or together form an optionally substituted $C_{1-4}$-alkylene residue, in the presence of polyanions. Furthermore, EP-A-686 662 discloses mixtures of A) neutral polythiophenes with the repeating structural unit of formula (I),

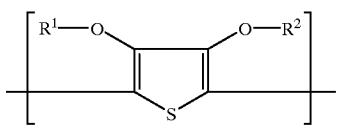

in which $R^1$ and $R^2$ independently of one another represent hydrogen or a C1–C4 alkyl group or together represent an optionally substituted C1–C4 alkylene residue, preferably an optionally with alkyl group substituted methylene, an optionally with C1–C12-alkyl or phenyl group substituted 1,2-ethylene residue or a 1,2-cyclohexene residue, and B) a di- or polyhydroxy- and/or carboxy groups or amide or lactam group containing organic compound; and conductive coatings therefrom which are tempered at elevated temperature, preferably between 100 and 250° C., during preferably 1 to 90 seconds to increase their resistance preferably to <300 ohm/square.

EP-A 614 123 discloses a water-soluble electrically conductive composition of matter comprising a polyacid and a polymer comprising at least one conjugated region composed of repeating units which contain a conjugated basic atom. However, as water-soluble electrically conductive polymer comprising at least one conjugated region composed of repeating units which contain a conjugated basic atom, only polyaniline and substituted polyanilines are exemplified.

EP-A 382 046 discloses an electrically conductive resist material, essentially comprising at least one ionic radiation-sensitive polymer and a soluble electrically conductive oligomer or a soluble electrically conductive polymer. Polymers of substituted thiophenes are exemplified, but no specific ionic radiation-sensitive polymers.

EP-A 338 786 discloses a negative working, photosensitive, overlay color proofing film which comprises, in order: (i) a transparent substrate; (ii) a photosensitive layer on the substrate, which photosensitive layer comprises a light sensitive, negative working, polymeric diazonium compound which is the polycondensation product of 3-methoxy-4-diazodiphenylamine sulfate and 4,4'-bis-methoxymethyl diphenyl ether precipitated as the chloride salt, which diazonium compound is present in sufficient amount to photosensitize the layer; and a water insoluble, water swellable binder resin in sufficient amount to bind the layer components in a uniform film; and at least one colorant in sufficient amount to uniformly color the layer; wherein upon imagewise exposure of the photosensitive layer to sufficient actinic radiation the film is capable of being developed with water alone.

Coated layers of organic electroconductive polymers can be structured into patterns using known microlithography techniques. In WO-A-97 18944 a process is described wherein a positive or negative photoresist is applied on top of a coated layer of an organic electroconductive polymer, and after the steps of selectively exposing the photoresist to UV light, developing the photoresist, etching the electroconductive polymer layer and finally stripping the non-developed photoresist with an organic solvent, a patterned layer is obtained. A similar technique has been described in 1988 in Synthetic Metals, volume 22, pages 265–271 for the design of an all-organic thin-film transistor. Such methods are cumbersome as they involve many steps and require the use of hazardous chemicals.

OBJECTS OF THE INVENTION

It is an aspect of the present invention to provide a material having a outermost layer that can be processed to an electroconductive pattern by a simple, convenient method which involves a low number of steps and which does not require the use of hazardous chemicals.

SUMMARY OF THE INVENTION

An electroconductive pattern can be realized with the materials of the present invention, which are optionally conductivity enhanced, by pattern-wise exposure, with or without a subsequent single wet processing step, and optional conductivity enhancement. No etching liquids or organic solvents are required.

The aspects of the present invention are realized by a material for making an electroconductive pattern, the material comprising a support and a light-exposure differentiable element, characterized in that the light-exposure differentiable element comprises an outermost layer containing a polyanion and a polymer or copolymer of a substituted or unsubstituted thiophene, and optionally a second layer contiguous with the outermost layer; and wherein the outermost layer and/or the optional second layer contains a light-sensitive component capable upon exposure of changing the removability of the exposed parts of the outermost layer relative to the unexposed parts of the outermost layer.

These objects are also realized by a method of making an electroconductive pattern on a support comprising the steps of:

providing a material as disclosed above;

image-wise exposing the material thereby obtaining a differentiation of the removability, optionally with a developer, of the exposed and the non-exposed areas of the outermost layer;

processing the material, optionally with the developer, thereby removing areas of the outermost layer; and optionally treating the material to increase the electroconductivity of the non-removed areas of the outermost layer.

These objects are also realized by a method of making an electroconductive pattern on a support without a removal step comprising the steps of:

providing a material for making an electroconductive pattern, said material comprising a support and a light-exposure differentiable element, characterized in that said light-exposure differentiable element comprises an outermost layer containing a polyanion and a polymer or copolymer of a substituted or unsubstituted thiophene having a surface resistivity lower than $10^6$ $\Omega$/square, and optionally a second layer contiguous with the outermost layer; and wherein the outermost layer and/or said optional second layer contains a bis(aryl diazosulfonate) compound according to formula (I):

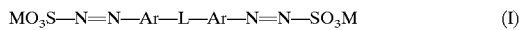

$$MO_3S—N\!=\!N—Ar—L—Ar—N\!=\!N—SO_3M \qquad (I)$$

where Ar is a substituted or unsubstituted aryl group, L is a divalent linking group, and M is a cation; capable upon exposure of changing the removability of the exposed parts of the outermost layer relative to the unexposed parts of the outermost layer; and image-wise exposing the material thereby obtaining reduction in the conductivity of the exposed areas relative to non-exposed areas, optionally with a developer.

Further advantages and embodiments of the present invention will become apparent from the following description.

DETAILED DESCRIPTION OF THE INVENTION

Definitions

The term "support" means a "self-supporting material" so as to distinguish it from a "layer" which may be coated on a support, but which is itself not self-supporting. It also includes any treatment necessary for, or layer applied to aid, adhesion to the light-exposure differentiable element.

The term electroconductive means having a surface resistivity below $10^6$ $\Omega$/square. Antistatic materials have surface resistivities in the range from $10^6$ to $10^{11}$ $\Omega$/square and cannot be used as an electrode.

The term electroconductive pattern means a pattern made up by the non-removed areas of the outermost layer, according to the present invention, which are electroconductive or can be made electroconductive by post-treatment.

Conductivity enhancement refers to a process in which the conductivity is enhanced e.g. by contact with high boiling point liquids such as di- or polyhydroxy- and/or carboxy groups or amide or lactam group containing organic compound optionally followed by heating at elevated temperature, preferably between 100 and 250° C., during preferably 1 to 90 seconds, results in conductivity increase. Alternatively in the case of aprotic compounds with a dielectric constant $\geq 15$, e.g. N-methyl-pyrrolidinone, temperatures below 100° C. can be used. Such conductivity enhancement is observed with polythiophenes and can take place during the preparation of the outermost layer or subsequently. Particularly preferred liquids for such treatment are N-methyl-pyrrolidinone and diethylene glycol such as disclosed in EP-A 686 662 and EP-A 1 003 179.

The term removability as used in the description and claims of the present invention means mechanically removable in the absence of a liquid or removable with the application of a liquid with or without the simultaneous or subsequent use of rubbing or other mechanical removal means. The application of liquid can dissolve, swell or disperse the outermost layer according to the present invention such that removal is realized or enabled.

The term light-exposure differentiable element means an element which upon light exposure produces changes in the properties or composition of the exposed parts of the element with respect to the properties or composition of the unexposed parts of the element.

The term multidiazonium salt includes all compounds with at least two groups with two nitrogen atoms bonded together with a double or triple bond, such groups including —N≡N$^+$ and —N=N—R groups e.g. —N=N—SO$_3$M groups.

The term resin comprising a diazonium salt means a resin with groups with two nitrogen atoms bonded together with a double or triple bond, such groups including —N≡N$^+$ and —N=N—R groups e.g. —N=N—SO$_3$M groups.

In the case of removal of parts (areas) of the outermost layer after pattern-wise exposure, the term surface resistivity ratio means the ratio of the surface resistivity of the parts (areas) of the light-exposure differentiable element from which parts (areas) of the outermost layer, according to the invention, have been removed to that of the parts (areas) of the light-exposure differentiable element from which no parts (areas) of the outermost layer, according to the invention, have been removed, after treatment to enhance the conductivity of the non-removed parts (areas) of the outermost layer if this is required to increase (enhance) the conductivity of the non-removed parts (areas) of the outermost layer.

In the case of non-removal of parts (areas) of the outermost layer after pattern-wise exposure, the term surface resistivity ratio means the ratio of the surface resistivity of the exposed parts (areas) of the outermost layer to that of the non-exposed parts (areas) of the outermost layer.

Material for Making an Electroconductive Pattern

The material for making an electroconductive pattern, according to the present invention, need not itself be electroconductive as long as patterns produced with such a material can be rendered electroconductive by a post-treatment process, such as a conductivity enhancement process. Furthermore, no material need be removed from the outermost layer containing a polymer or copolymer of a substituted or unsubstituted thiophene, according to the present invention, in order to realize an electroconductive pattern, after optional processing to remove the residual light-sensitive component, as long as differential removability subsequent to exposure is feasible. In this case the light-sensitive component present is capable upon exposure of realizing this effect as well as changing the removability of the exposed parts of the outermost layer relative to the unexposed parts of the outermost layer. The optional second layer must be between the outermost layer and the support as it cannot be the outermost layer.

Electroconductive

The term "electroconductive" is related to the electric resistivity of the material. The electric resistivity of a layer is generally expressed in terms of surface resistivity $R_s$ (unit $\Omega$; often specified as $\Omega$/square). Alternatively, the electroconductivity may be expressed in terms of volume resistivity $R_v = R_s \cdot d$, wherein d is the thickness of the layer, volume conductivity $k_v = 1/R_v$ [unit: S(iemens)/cm] or surface conductivity $k_s = 1/R_s$ [unit: S(iemens).square].

All values of electric resistivity presented herein are measured according to one of the following methods. In the first method the support coated with the electroconductive outermost layer is cut to obtain a strip having a length of 27.5 cm and a width of 35 mm and strip electrodes are applied over its width at a distance of 10 cm perpendicular to the edge of the strip. The electrodes are made of an electroconductive polymer, ECCOCOAT CC-2 available from Emerson & Cumming Speciality polymers. Over the electrode a constant potential is applied and the current flowing through the circuit is measured on a pico-amperometer KEITHLEY 485. From the potential and the current, taking into account the geometry of the area between the electrodes, the surface resistivity in $\Omega$/square is calculated.

In the second method, the surface resistivity was measured by contacting the outermost layer with parallel copper electrodes each 35 mm long and 35 mm apart capable of forming line contacts, the electrodes being separated by a teflon insulator. This enables a direct measurement of the surface resistivity.

Support

Supports for use according to the present invention include polymeric films, silicon, ceramics, oxides, glass, polymeric film reinforced glass, glass/plastic laminates, metal/plastic laminates, paper and laminated paper, optionally treated, provided with a subbing layer or other adhesion promoting means to aid adhesion to the light-exposure differentiable element. Suitable polymeric films are poly(ethylene terephthalate), poly(ethylene naphthalate), polystyrene, polyethersulphone, polycarbonate, polyacrylate, polyamide, polyimides, cellulosetriacetate, polyolefins and polyvinylchloride, optionally treated by corona discharge or glow discharge or provided with a subbing layer.

In the case of the realization of an electroconductive pattern via removal of exposed or non-exposed areas such treatment or subbing layer should not hinder complete removal, whereas if the electroconductive pattern can be realized without removal of exposed or non-exposed areas such treatment should make removal of non-exposed or exposed areas more difficult.

In a first embodiment of the material according to the present invention the support is treated with a corona discharge or a glow discharge. Both corona discharge and glow discharge enable the use of polymeric films as a support without a subbing layer. Such materials can be developed, optionally while softly rubbing, and still yield an excellent conductivity ratio between exposed and non-exposed areas.

Light-Exposure Differentiable Element

A light-exposure differentiable element, according to the present invention, is an element which upon light exposure produces changes in the properties or composition of the exposed parts of the element with respect to the properties or composition of the unexposed parts of the element. Examples of such changes are exposure-induced crosslinking; exposure-induced increase or decrease of solubility; and exposure-induced increase or decrease of adhesion to the support.

According to the present invention, these changes in the properties or composition of the light-exposure differentiable element are due to the presence of a light-sensitive component in the outermost layer and/or the second layer, which enables either the exposed or unexposed parts of the outermost layer to be removed, optionally with the assistance of a developer, i.e. the removability can either be rendered more (positive working) or less (negative working) removable by a developer upon exposure to light.

In a second embodiment of the material according to the present invention the light-sensitive component capable upon exposure of changing the removability of the exposed parts of the outermost layer relative to the unexposed parts of the outermost layer is a multidiazonium salt or a resin comprising a diazonium salt, which reduces the removability of exposed parts of the outermost layer. Combinations of resins comprising a diazonium salt can also be used. If the light-sensitive component is a multidiazonium salt or a resin comprising a diazonium salt, increasing the pH of the coating dispersions and solutions used in preparing the light-exposure differentiable element has been found to improve the shelf-life, i.e. retention of properties upon storage, of materials according to the present invention. pH's between 2.5 and 9 are preferred, with pH's between 3 and 6 being particularly preferred. Such pH's can, for example, be realized by adding ammonium hydroxide.

In a third embodiment of the material according to the present invention the light-sensitive component capable upon exposure of changing the removability of the exposed parts of the outermost layer relative to the unexposed parts of the outermost layer is a quinone diazide compound, which increases the removability of exposed parts of the outermost layer.

In a fourth embodiment of the material according to the present invention the outermost layer has a surface resistivity lower than $10^6$ $\Omega$/square.

In a fifth embodiment of the material according to the present invention the outermost layer has a surface resistivity lower than $10^4$ $\Omega$/square.

In a sixth embodiment of the material according to the present invention the outermost layer has a surface resistivity capable of being lower than $10^6$ $\Omega$/square after treatment in a so-called conductivity enhancement process.

Polymer or copolymer of a substituted or unsubstituted thiophene

In a seventh embodiment of the material according to the present invention the polymer of a substituted or unsubstituted thiophene corresponds to the formula (II):

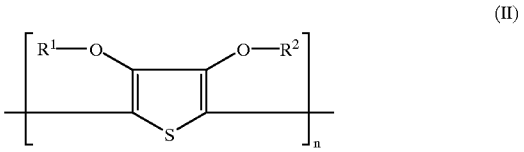

in which n is larger than 1 and each of $R^1$ and $R^2$ independently represents hydrogen or an optionally substituted $C_{1-4}$ alkyl group or together represent an optionally substituted $C_{1-4}$ alkylene group or an optionally substituted cycloalkylene group, preferably an ethylene group, an optionally alkyl-substituted methylene group, an optionally $C_{1-12}$ alkyl- or phenyl-substituted ethylene group, a 1,3-propylene group or a 1,2-cyclohexylene group.

The preparation of such a polythiophene and of aqueous dispersions containing such a polythiophene and a polyanion is described in EP-A-440 957 and corresponding U.S. Pat. No. 5,300,575. Basically the preparation of polythiophene proceeds in the presence of polymeric polyanion compounds by oxidative polymerisation of 3,4-dialkoxythiophenes or 3,4-alkylenedioxythiophenes according to the following formula:

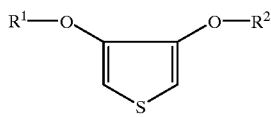

wherein $R^1$ and $R^2$ are as defined above.

Stable aqueous polythiophene dispersions having a solids content of 0.05 to 55% by weight and preferably of 0.1 to 10% by weight can be obtained by dissolving thiophenes corresponding to the formula above, a polyacid and an oxidising agent in an organic solvent or preferably in water, optionally containing a certain amount of organic solvent, and then stirring the resulting solution or emulsion at 0° C. to 100° C. until the polymerisation reaction is completed. The polythiophenes formed by the oxidative polymerisation are positively charged, the location and number of such positive charges being not determinable with certainty and therefore not mentioned in the general formula of the repeating units of the polythiophene polymer.

The oxidising agents are those which are typically used for the oxidative polymerisation of pyrrole as described in for example J. Am. Soc. 85, 454 (1963). Preferred inexpensive and easy-to-handle oxidising agents are iron(III) salts, e.g. $FeCl_3$, $Fe(ClO_4)_3$ and the iron(III) salts of organic acids and inorganic acids containing organic residues. Other suitable oxidising agents are $H_2O_2$, $K_2Cr_2O_7$, alkali or ammonium persulphates, alkali perborates, potassium permanganate and copper salts such as copper tetrafluoroborate. Air or oxygen can also be used as oxidising agents. Theoretically, 2.25 equivalents of oxidising agent per mol of thiophene are required for the oxidative polymerisation thereof (J. Polym. Sci. Part A, Polymer Chemistry, Vol. 26, p.1287, 1988). In practice, however, the oxidising agent is used in excess, for example, in excess of 0.1 to 2 equivalents per mol of thiophene.

Polyanion

The polyacid forms a polyanion or, alternatively, the polyanion can be added as a salt of the corresponding polyacids, e.g. an alkali salt. Preferred polyacids or salts thereof are polymeric carboxylic acids such as poly(acrylic acid), poly((meth)acrylic acid) and poly(maleic acid) or polymeric sulphonic acids such as poly(styrene sulphonic acid) or poly(vinyl sulphonic acid). Alternatively, copolymers of such carboxylic and/or sulphonic acids and of other polymerizable monomers such as styrene or acrylates can be used.

In an eighth embodiment of the material according to the present invention the polyanion is poly(styrene sulphonate).

The molecular weight of these polyanion forming polyacids is preferably between 1000 and $2\times10^6$, more preferably between 2000 and $5\times10^5$. These polyacids or their alkali salts are commercially available and can be prepared according to the known methods, e.g. as described in Houben-Weyl, Methoden der Organische Chemie, Bd. E20 Makromolekulare Stoffe, Teil 2, (1987), pp. 1141.

Dispersion of a Polyanion and a Polymer or Copolymer of a Substituted or Unsubstituted Thiophene The coating dispersion or solution of a polyanion and a polymer or copolymer of a substituted or unsubstituted thiophene can also comprise additional ingredients, such as one or more binders, one or more surfactants, spacing particles, UV-acutance compounds or IR-absorbers.

Anionic and non-ionic surfactants are preferred. Suitable surfactants include ZONYL™ FSN 100 and ZONYL™ FSO 100, an ethoxylated non-ionic fluoro-surfactant with the structure: $F(CF_2CF_2)_yCH_2CH_2O(CH_2CH_2O)_xH$, where x=0 to ca. 15 and y=1 to ca. 7, both from Du Pont.

The coating dispersion or solution of a polyanion and a polymer or copolymer of a substituted or unsubstituted thiophene preferably also comprises an organic compound that is: a linear, branched or cyclic aliphatic $C_{2-20}$ hydrocarbon or an optionally substituted aromatic $C_{6-14}$ hydrocarbon or a pyran or a furan, the organic compound comprising at least two hydroxy groups or at least one —COX or —CONYZ group wherein X denotes —OH and Y and Z independently of one another represent H or alkyl; or a heterocyclic compound containing at least one lactam group. Examples of such organic compounds are e.g. N-methyl-2-pyrrolidinone, 2-pyrrolidinone, 1,3-dimethyl-2-imidazolidone, N,N,N',N'-tetramethylurea, formamide, dimethylformamide, and N,N-dimethylacetamide. Preferred examples are sugar or sugar derivatives such as arabinose, saccharose, glucose, fructose and lactose, or di- or polyalcohols such as sorbitol, xylitol, mannitol, mannose, galactose, sorbose, gluconic acid, ethylene glycol, di- or tri(ethylene glycol), 1,1,1-trimethylol-propane, 1,3-propanediol, 1,5-pentanediol, 1,2,3-propantriol, 1,2,4-butantriol, 1,2,6-hexantriol, or aromatic di- or polyalcohols such as resorcinol.

Multidiazonium Salts

A multidiazonium salt is a salt with at least two groups with two nitrogen atoms bonded together with a double or triple bond, such groups including —N≡N⁺ and —N=N—R groups, e.g. —N=N—SO₃M groups e.g. bisdiazonium salts, trisdiazonium salts, tetrakisdiazonium salts, bis(aryldiazosulphonate) salts, tris(aryldiazosulphonate) salt and terakis(bis(aryldiazosulphonate) salts.

Upon exposure the light-exposure differentiable element containing a multidiazonium salt is converted from water removable to water unremovable (due to the destruction of the diazonium groups) and additionally the photolysis products of the diazo may increase the level of crosslinking of the polymeric binder or resin comprising a multidiazonium salt if present, thereby selectively converting the surface, into an image pattern, from removable to unremovable. The unexposed areas remain unchanged, i.e. removable. Combinations of multidiazonium salts can also be used.

Bisdiazonium salts for use in the present invention include: benzidine tetrazoniumchloride, 3,3'-dimethylbenzidine tetrazoniumchloride, 3,3'-dimethoxybenzidine tetrazoniumchloride, 4,4'-diaminodiphenylamine tetrazoniumchloride, 3,3'-diethylbenzidine tetrazoniumsulphate, 4-aminodiphenylamine diazoniumsulphate, 4-aminodiphenylamine diazoniumchloride, 4-piperidino aniline diazoniumsulphate, 4-diethylamino aniline diazoniumsulphate and oligomeric condensation products of diazodiphenylamine and formaldehyde.

In a ninth embodiment of the material according to the present invention the light-sensitive component capable upon exposure of changing the removability of the exposed parts of the outermost layer relative to the unexposed parts of the outermost layer is a bis(aryldiazosulphonate) salt, a tris(aryldiazosulphonate) salt or a tetrakis(aryldiazosulphonate) salt, which reduces the removability of exposed parts of the outermost layer.

In an tenth embodiment of the material according to the present invention the light-sensitive component capable upon exposure of changing the removability of the exposed parts of the outermost layer relative to the unexposed parts of the outermost layer is a bis(aryldiazosulphonate) salt, which reduces the removability of exposed parts of the outermost layer, according to formula (I):

alkylene group, whose chain is optionally substituted with at least one of an oxygen atom, a sulphur atom or a nitrogen atom. Ar preferably represents an unsubstituted phenyl group or a phenyl group substituted with one or more alkyl groups, aryl groups, alkoxy groups, aryloxy groups or amino groups. M preferably represents a cation such as $NH_4^+$ or a metal ion such as a cation of Al, Cu, Zn, an alkaline earth metal or alkali metal.

Particularly suitable bis(aryldiazosulphonate) salts, according to the present invention, are:

| | $\lambda_{max}$ [nm] | absorption of a 25 ppm solution in water | |
|---|---|---|---|
| BADS01 | 308 | 0.785 | |
| BADS02 | 308 | 1.568 | |
| BADS03 | — | | |

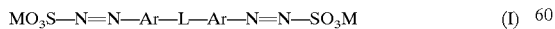

$$MO_3S-N=N-Ar-L-Ar-N=N-SO_3M \qquad (I)$$

where Ar is a substituted or unsubstituted aryl group, L is a divalent linking group, and M is a cation. L preferably represents a substituted or unsubstituted divalent aryl group or a substituted or unsubstituted saturated or unsaturated In an eleventh embodiment of the material according to the present invention the light-sensitive component capable upon exposure of changing the removability of the exposed parts of the outermost layer relative to the unexposed parts of the outermost layer is a bis(aryldiazosulphonate) salt, which reduces the removability of exposed parts of the outermost layer, is selected from the group consisting of BADS01, BADS02 and BADS03.

In a first embodiment of the method of making an electroconductive pattern on a support without a removal step, according to the present invention, the aryldiazosulfonate according to formula (I) is selected from the group consisting of BADS01, BADS02 and BADS03.

Resins Comprising a Diazonium Salt

The term resin comprising a diazonium salt means a resin with groups with two nitrogen atoms bonded together with a double or triple bond, such groups including —N≡N$^+$ and —N=N—R groups e.g. —N=N—SO$_3$M groups. Suitable resins comprising a diazonium salt, according to the present invention, include polymers or copolymers of an aryldiazosulphonate and condensation products of an aromatic diazonium salt. Such condensation products are described, for example, in DE-P-1 214 086.

Upon exposure the light-exposure differentiable element containing resins comprising a diazonium salt are converted from removable to unremovable (due to the destruction of the diazonium groups) and additionally the photolysis products of the diazo may increase the level of crosslinking of the polymeric binder or resin comprising a diazonium salt, thereby selectively converting the surface, into an image pattern, from removable to unremovable. The unexposed areas remain unchanged, i.e. removable.

In a twelfth embodiment of the material according to the present invention the light-sensitive component capable upon exposure of changing the removability of the exposed parts of the outermost layer relative to the unexposed parts of the outermost layer is a polymer or copolymer of an aryldiazosulphonate, which reduces the removability of exposed parts of the outermost layer.

In a thirteenth embodiment of the material according to the present invention the light-sensitive component capable upon exposure of changing the removability of the exposed parts of the outermost layer relative to the unexposed parts of the outermost layer is a polymer or copolymer of an aryldiazosulphonate, which reduces the removability of exposed parts of the outermost layer, represented by formula (III):

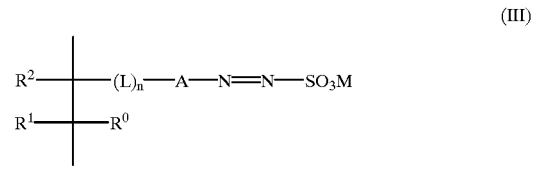

(III)

wherein $R^0$, $R^1$ and $R^2$ each independently represent hydrogen, an alkyl group, a nitrile or a halogen, e.g. Cl, L represents a divalent linking group, n represents 0 or 1, A represents an aryl group and M represents a cation. L preferably represents divalent linking group selected from the group consisting of: —(X)$_t$—CONR$^3$—, —(X)$_t$—COO—, —X— and —(X)$_t$—CO—, wherein t represents 0 or 1; $R^3$ represents hydrogen, an alkyl group or an aryl group; X represents an alkylene group, an arylene group, an alkylenoxy group, an arylenoxy group, an alkylenethio group, an arylenethio group, an alkylenamino group, an arylenamino group, oxygen, sulphur or an aminogroup. A preferably represents an unsubstituted aryl group, e.g. an unsubstituted phenyl group or an aryl group, e.g. phenyl, substituted with one or more alkyl groups, aryl groups, alkoxy groups, aryloxy groups or amino groups. M preferably represents a cation such as NH$^{4+}$ or a metal ion such as a cation of Al, Cu, Zn, an alkaline earth metal or alkali metal.

Polymers and copolymers of an aryldiazosulphonate can be prepared by homo- or copolymerization of aryldiazosulphonate monomers with other aryldiazosulphonate monomers and/or with vinyl monomers such as (meth)acrylic acid or esters thereof, (meth)acrylamide, acrylonitrile, vinylacetate, vinylchloride, vinylidene chloride, styrene, alpha-methyl styrene etc. A particularly preferred comonomer is hydroxyethylmethacrylate. Suitable aryldiazosulphonate monomers for preparing such polymers and copolymers of an aryldiazosulphonate, as used in the present invention, are:

ADS-MONOMER 01

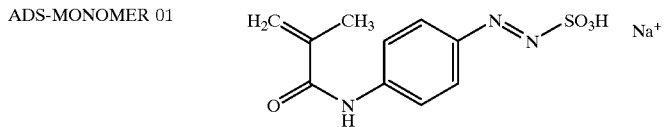

ADS-MONOMER 02

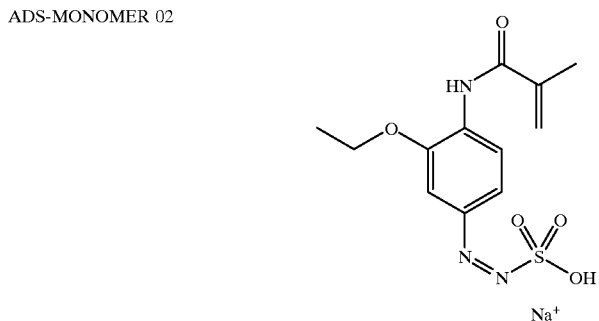

-continued
ADS-MONOMER 03
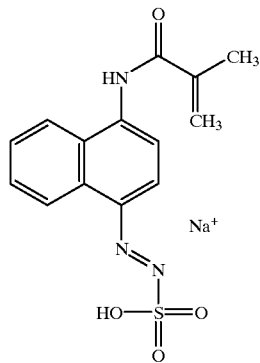
ADS-MONOMER 04
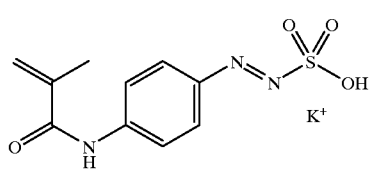
ADS-MONOMER 05
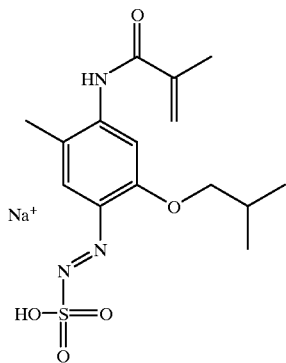
ADS-MONOMER 06
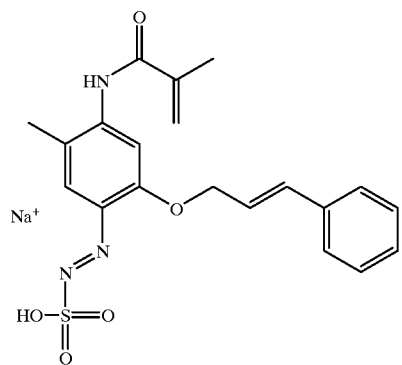

-continued

ADS-MONOMER 07

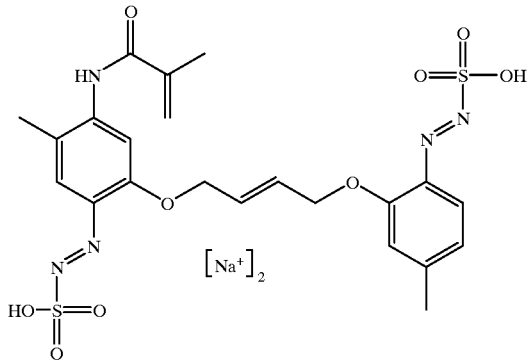

Specific examples of suitable aryldiazosulphonate polymers are described in EP-A-771 645.

Suitable resins comprising a diazonium salt, according to the present invention, are given below. In the case of polymers and copolymers of an aryldiazosulphonate, the respective monomer ratios are expressed as percentages by weight.

| | |
|---|---|
| NDP01 = | Negalux N18, a diphenylamine diazonium resin from PCAS |
| NDP02 = | diazo resin No. 8 from FAIRMOUNT CHEMICAL |
| NDP03 = | methyl methacrylate, ADS-MONOMER 01 (82/18) copolymer |
| NDP04 = | homopolymer of ADS-MONOMER 01 |
| NDP05 = | hydroxyethylacrylate, ADS-MONOMER 01 (80/20) copolymer |
| NDP06 = | methyl methacrylate, ADS-MONOMER 01 (80/20) copolymer |
| NDP07 = | N-isopropyl-acrylamide, ADS-MONOMER 01 (80/20) copolymer |
| NDP08 = | N-isopropyl-acrylamide, ADS-MONOMER 0l (85/15) copolymer |
| NDP09 = | N-t-butyl-acrylamide, ADS-MONOMER 01 (75/25) copolymer |
| NDP10 = | N-t-butyl-acrylamide, ADS-MONOMER 01 (70/30) copolymer |
| NDP11 = | hydroxyethyl methacrylate, 2-propenoic acid, 2-methyl-,2-[{[(2-nitrophenyl)methoxy]carbonyl}amino]ethyl ester, ADS-MONOMER 01 (85/10/5) terpolymer |
| NDP12 = | hydroxyethyl methacrylate, ADS-MONOMER 01 (95/5) copolymer |
| NDP13 = | hydroxyethyl methacrylate, ADS-MONOMER 01 (97/3) copolymer |
| NDP14 = | hydroxyethyl methacrylate, ADS-MONOMER 01 (90/10) copolymer |
| NDP15 = | hydroxyethyl methacrylate, ADS-MONOMER 01 (80/20) copolymer |
| NDP16 = | methyl methacrylate, ADS-MONOMER 01 (40/60) copolymer |
| NDP17 = | methyl methacrylate, ADS-MONOMER 01 (60/40) copolymer |
| NDP18 = | phenyl methacrylate, ADS-MONOMER 01 (40/60) copolymer |
| NDP19 = | 3-methacryloxypropyltriisopropylsilane, methyl methacrylate, ADS-MONOMER 01 (10/70/20) copolymer |
| NDP20 = | 2-propenoic acid 2-phosphonooxy)ethyl ester, methyl methacrylate, ADS-MONOMER 01 (2/80/18) copolymer |
| NDP21 = | acrylic acid, ADS-MONOMER 01 (80/20) copolymer |
| NDP22 = | 4-(2-acryloyloxyethoxy)phenyl 2-hydroxy-2-propyl ketone, methyl methacrylate, ADS-MONOMER 01 (10/70/20) copolymer |
| NDP23 = | acrylonitrile, methyl methacrylate, ADS-MONOMER 01 (10/70/20) copolymer |
| NDP24 = | ADS-MONOMER 06, methyl methacrylate, ADS-MONOMER 01 (5/80/15) copolymer |
| NDP25 = | ADS-MONOMER 07, methyl methacrylate, ADS-MONOMER 01 (3/82/15) copolymer |

-continued

| | |
|---|---|
| NDP26 = | methyl methacrylate, ADS-MONOMER 02 (80/20) copolymer |
| NDP27 = | methyl methacrylate, ADS-MONOMER 03 (80/20) copolymer |
| NDP28 = | methyl methacrylate, ADS-MONOMER 05 (75/25) copolymer |
| NDP29 = | methyl methacrylate, ADS-MONOMER 04 (80/20) copolymer |
| NDP30 = | methyl methacrylate, ADS-MONOMER 01 (ammonium salt) (80/20) copolymer |
| NDP31 = | methyl methacrylate, ADS-MONOMER 01 (tetramethylammonium salt) (80/20) copolymer |
| NDP32 = | methyl methacrylate, ADS-MONOMER 01 (tetraethylammonium salt) (80/20) copolymer |
| NDP33 = | hydroxyethyl methacrylate, ADS-MONOMER 01 (85/15) copolymer |
| NDP34 = | condensation product of 4-diazodiphenylamine sulphate and formaldehyde |
| NDP35 = | condensation product of 4-diazodiphenylamine toluene sulphonate and formaldehyde |
| NDP36 = | condensation product of 4-diazodiphenylamine tetrafluoroborate and formaldehyde |

In a fourteenth embodiment of the material according to the present invention in the light-exposure differentiable element the weight ratio of the polymer or copolymer of an aryldiazosulphonate to the polymer or copolymer of a substituted or unsubstituted thiophene is between 10:200 and 400:200.

Combination of a Multidiazonium Salt and a Resin Comprising a Diazonium Salt

In a fifteenth embodiment of the material according to the present invention the light-sensitive component capable upon exposure of changing the removability of the exposed parts of the outermost layer relative to the unexposed parts of the outermost layer is a combination of a resin comprising an aryldiazosulphonate, which reduces the removability of exposed parts of the outermost layer, and a bis (aryldiazosulphonate) salt, which reduces the removability of exposed parts of the outermost layer.

In a sixteenth embodiment of the material according to the present invention the light-sensitive component capable upon exposure of changing the removability of the exposed parts of the outermost layer relative to the unexposed parts of the outermost layer is a combination of a resin comprising an aryldiazosulphonate, which reduces the removability of exposed parts of the outermost layer, and a bis (aryldiazosulphonate) salt, which reduces the removability of exposed parts of the outermost layer, in the weight percentage ratio range of 60%/40% to 10%/90%.

In a seventeenth embodiment of the material according to the present invention the light-sensitive component capable upon exposure of changing the removability of the exposed parts of the outermost layer relative to the unexposed parts of the outermost layer is a combination of a resin comprising an aryldiazosulphonate, which reduces the removability of exposed parts of the outermost layer, and a bis (aryldiazosulphonate) salt, which reduces the removability of exposed parts of the outermost layer, in the weight percentage ratio range of 50%/50% to 20%/80%.

In an eighteenth embodiment of the material according to the present invention the light-sensitive component capable upon exposure of changing the removability of the exposed parts of the outermost layer relative to the unexposed parts of the outermost layer is a combination of a copolymer of hydroxyethylmethacrylate and sodium-4-methacryloyl-aminophenyl-diazo-sulphonate, which reduces the removability of exposed parts of the outermost layer, and an bis(aryldiazosulphonate) salt, which reduces the removability of exposed parts of the outermost layer.

Quinone Diazide Compounds

In a nineteenth embodiment of the material according to the present invention the light-sensitive component capable upon exposure of changing the removability of the exposed parts of the outermost layer relative to the unexposed parts of the outermost layer is a quinonediazide compound, which increases the removability of exposed parts of the outermost layer.

In a twentieth embodiment of the material according to the present invention the light-sensitive component capable upon exposure of changing the removability of the exposed parts of the outermost layer relative to the unexposed parts of the outermost layer is an o-quinone-diazide compound (NQD), which increases the removability of exposed parts of the outermost layer.

Particularly preferred o-quinone-diazide compounds are o-naphthoquinonediazidosulphonic acid esters or o-naphthoquinone diazidocarboxylic acid esters of various hydroxyl compounds and o-naphthoquinonediazidosulphonic acid amides or o-naphthoquinonediazidocarboxylic acid amides of various aromatic amine compounds.

Two variants of NQD systems can be used: one-component systems and two-component systems. In the former case, the sulphonic or carboxyl acid group is linked directly to the phenolic hydroxy group of a water insoluble, alkali soluble or swellable resin having a phenolic hydroxy group. It is preferred that some phenolic hydroxy groups remain unsubstituted. Examples of such compounds include phenol, cresol, resorcinol and pyrogallol. Examples of preferred water insoluble, alkali soluble or swellable resins having a phenolic hydroxy group include phenol-formaldehyde resin, cresol-formaldehyde resin, pyrogallol-acetone resin and resorcinol-benzaldehyde resin. Typical examples include esters of napthoquinone-(1,2)-diazidosulphonic acid and phenol-formaldehyde resin or cresol-formaldehyde resin, esters of naphthoquinone-(1,2)-diazido-(2)-5-sulphonic acid and pyrogallol-acetone resin as disclosed in U.S. Pat. No. 3,635,709 and esters of naphthoquinone-(1,2)-diazido-(2)-5-sulphonic acid and resorcinol-pyrogallol-acetone copolycondensates as disclosed in JP KOKAI No. Sho 55-76346.

Examples of other useful compounds are polyesters having hydroxyl groups at their termini esterified with o-naphthoquinonediazidesulphonyl chloride as disclosed in JP KOKAI No. Sho 50-117503; homopolymers of p-hydroxystyrene or copolymers thereof with other copolymerizable monomers esterified with o-naphthoquinonediazidosulphonyl chloride as disclosed in JP KOKAI No. Sho 50-113305; condensates of alkyl acrylate-acryloyloxyalkyl carbonate-hydroxyalkyl acrylate copolymers with o-naphthoquinonediazidosulphonyl chloride as disclosed in U.S. Pat. No. 3,859,099; amides of copolymers of p-aminostyrene and monomers copolymerizable therewith and o-naphthoquinonediazido-sulphonic acid or o-naphthoquinonediazidocarboxylic acid as disclosed in U.S. Pat. No. 3,759,711; as well as ester compounds of polyhydroxybenzophenone and o-naphthoquinonediazidosulphonyl chloride.

In a twenty-first embodiment of the material according to the present invention the light-sensitive component capable upon exposure of changing the removability of the exposed parts of the outermost layer relative to the unexposed parts of the outermost layer is an o-quinone-diazide compound (PQD), which increases the removability of exposed parts of the outermost layer, and the light-exposure differentiable element further contains an alkali soluble resin.

Particularly suitable quinonediazide compounds according to the present invention are:

| | |
|---|---|
| PQD01 = | AZ 7217, a positive working photoresist from CLARIANT |
| PQD02 = | 2-diazo-1-naphthol-5-sulfonic acid sodium salt |
| PQD03 = | 1-diazo-2-naphthol-4-sulfonic acid sodium salt |
| PQD04 = | 2-diazo-1-naphthol-5-(4'-methyl-phenylsulphonate) |
| PQD05 = | 2-diazo-1-naphthol-5-phenylsulphonate |
| PQD06 = | bis(6'-diazo-5'-oxy-5'-sulphonate naphthalene)-2,4-benzophenone |
| PQD07 = | 2-diazo-1-oxy-(2'-benzotriazolyl-4'-methyl-phenyl)-5-sulphonate naphthalene |
| PQD08 = | partial esterification product of 1,2-naphthoquinone (2) diazide-5-sulfonyl chloride and a p-t-butylphenol-formaldehyde copolymer |
| PQD09 = | partial esterification product of 1,2-naphthoquinone diazide-5-sulfonyl chloride and a cresol formaldehyde polymer |
| PQD10 = | partial esterification product of 1,2-naphthoquinone (2) diazide-5-sulfonylchloride and a p-cresol-formaldehyde resin |
| PQD11 = | partial esterification product of 1,2-naphthoquinone (2) diazide-5-sulfonyl chloride and a p-t-butylphenol-formaldehyde copolymer |

Binders

In the materials for making an electroconductive pattern, according to the present invention, the light-exposure differentiable element contains a binder.

In a twenty-second embodiment of the material according to the present invention the outermost layer contains a binder, e.g. polyvinyl alcohol and a vinylidene chloride, methyl methacrylate, itaconic acid (88/10/2) terpolymer, if the light-sensitive component capable upon exposure of changing the removability of the exposed parts of the outermost layer relative to the unexposed parts of the outermost layer is present in the outermost layer.

In a twenty-third embodiment of the material according to the present invention the optional second layer contains a binder, e.g. polyvinyl alcohol and a hydroxyethyl methacrylate copolymer, if the light-sensitive component capable upon exposure of changing the removability of the exposed parts of the outermost layer relative to the unexposed parts of the outermost layer is present in the second layer.

Suitable binders for use in the present invention are described in EP-A 564 911 and include water-soluble polymers, such as poly(vinyl alcohol), water-soluble homo- and co-polymers of acrylic acid and homo- and co-polymers of methacrylic acid, and polymer latexes. Preferred binders include poly(vinyl alcohol) and homo- and co-polymers of hydroxyethyl methacrylate and copolymers of 2-propenoic acid 2-phosphonooxy)ethyl ester, copolymers of 2-methyl-2-propenoic acid 2-phosphonooxy)ethyl ester. Such binders may be treated with a hardening agent, e.g. an epoxysilane such as 3-glycidyloxypropyltrimethoxysilane as described in EP-A 564 911, which is especially suitable when coating on a glass substrate.

In the application of NQD as two-component systems various low-molecular NQD sulphonic or carboxyl acid derivatives are dissolved mainly in certain water insoluble, alkali soluble or swellable resins; the latter acts as polymeric binder for NQD. Preferably the 4- or 5-sulphonyl or carboxyl substituted 1,2 naphthoquinonediazides are esters of 1,2 naphthoquinonediazides-4- or -5-sulphonic or carboxylic acids with a phenolic compound having at least two phenolic hydroxy groups, more preferably with a phenolic compound having at least three phenolic hydroxy groups. Further suitable 1,2 naphthoquinone-2-diazides are disclosed in GB-A 739654 and in U.S. Pat. No. 4,266,001. Preferred water insoluble, alkali soluble or swellable resins are resins, which comprise phenolic hydroxy groups, oxime groups or sulphonamido groups. More preferred are resins having phenolic hydroxy groups, and phenolic hydroxy functionalized derivatives of poly(meth)acrylates, which can be synthesised starting from e.g. hydroxyethyl(meth) acrylate. Most preferred are synthetic novolac resins and typical examples thereof are phenolformaldehyde resin, cresol-formaldehyde resin, and phenol-cresol-formaldehyde copolycondensed resins as disclosed in JP KOKAI No. Sho 55-57841.

Exposure Process

The material of the present invention can be image-wise exposed to ultraviolet light optionally in combination with blue light in the wavelength range of 250 to 500 nm or infrared light. Upon image-wise exposure, a differentiation of the removability with a developer of the exposed and non-exposed areas is induced. Useful exposure sources are high or medium pressure halogen mercury vapour lamps, e.g. of 1000 W or lasers having an emission wavelength in the range from about 700 to about 1500 nm, such as a semiconductor laser diode, a Nd:YAG laser or a Nd:YLF laser.

Development Process

After the image-wise exposure the material is developed in a developer which can be deionized water or is preferably water-based. During development the exposed (positive working) or non-exposed (negative working) areas together with the electroconductive polymer are removed and an electroconductive pattern is thereby obtained. Suitable aqueous developers are deionized water, AZ303 (Clariant) or EN232 (AGFA-GEVAERT N.V.). When a subbing layer (also called substrate layer) is present on the support the material is preferably rubbed thoroughly with a tissue during development to avoid residual conductivity. The rubbing can be done in the processing fluid or in a separate water bath after the development stage. Equal results can be obtained by applying a high pressure water jet after the development stage, thereby avoiding contact with the conductive areas. Alternatively, if conductivity enhancement is necessary, the developer can contain the conductivity enhancement agent, thereby combining the steps of development and contact with the conductivity enhancement agent.

While the present invention will hereinafter be described in connection with preferred embodiments thereof, it will be understood that it is not intended to limit the invention to those embodiments. All percentages given in the EXAMPLES are percentages by weight unless otherwise stated.

EXAMPLES

Ingredients used in the light-exposure differentiable element which are not mentioned above:

PEDOT=poly(3,4-ethylenedioxythiophene)

PSS=polystyrene sulphonic acid)

LATEX01=vinylidene chloride, methyl methacrylate, itaconic acid (88/10/2) terpolymer, available as 30% aqueous dispersion Z6040=3-glycidoxypropyltrimethoxysilane from DOW CORNING ZONYL™FSO 100=an ethoxylated non-ionic fluorosurfactant with the structure: $F(CF_2CF_2)_yCH_2CH_2O(CH_2CH_2O)_xH$, where x=0 to ca. 15 and y=1 to ca. 7 from Du Pont Ingredients used in the subbing layers:

=a copolyester of 26.5 mol % terephthalic acid, 20

LATEX02=mol % isophthalic acid, 3.5 mol % 5-sulphoisophthalic acid and 50 mol % ethylene glycol available as a 20% aqueous dispersion;

LATEX03=a copolymer of 80% ethyl acrylate and 20% methacrylic acid available as a 27% aqueous dispersion;

LATEX04=a copolymer of 49% methyl methacrylate, 49% of butadiene and 2% itaconic acid;

KIESELSOL 100F=a colloid silica from BAYER, available as a 30% aqueous dispersion;

KIESELSOL 300F=a colloidal silica from BAYER, available as a 30% aqueous dispersion;

ARKOPON™ T=a sodium salt of N-methyl-N-2-sulfoethyloleylamide by HOECHST a surfactant from HOECHST, supplied as a 40% concentrate;

MERSOLAT™H76=a sodium pentadecylsulfonate by BAYER, supplied as a 76% concentrate;

ULTRAVON™ W=a sodium arylsulfonate from CIBA-GEIGY, supplied as a 75–85% concentrate;

ARKOPAL™ N060=a nonylphenylpolyethylene-glycol from HOECHST;

HORDAMER™ PE02=polyethylene from HOECHST, available as a 40% aqueous dispersion;

PAREZ RESIN™=melamine-formaldehyde resin from AMERICAN CYANAMID 613 available as 80% solids;

The following supports based on 100 μm polyethylene terephthalate film were used in the EXAMPLES:

| Support nr. | Composition |
|---|---|
| 01 | subbing layer consisting of 79.1% LATEX01; 18.6% KIESELSOL ™ 100F; 0.5% MERSOLAT ™ H; and 1.9% ULTRAVON ™ W |
| 02 | surface treated with a corona discharge |
| 03 | surface treated with an glow discharge |
| 04 | subbing layer consisting of a first layer of 79.1% LATEX0l; 18.6% KIESELSOL ™ 100F; 0.5% MERSOLAT ™ H; and 1.9% ULTRAVON ™ W; and an outermost layer consisting of 49% gelatin, 44% KIESELSOL ™ 300F, 1.72% ULTRAVON ™ W, 0.86% ARKOPAL ™ N060, 2.86% hexylene glycol, 1.43% trimethylol propane and 0.13% polymethyl methacylate, a 3 μm matting agent. |
| 05 | subbing layer consisting of 77.2% of LATEX02; 5.8% of LATEX03; 1.3% HORDAMER ™ PE02 and 14.6% PAREZ RESIN ™ 613. |

-continued

| Support nr. | Composition |
|---|---|
| 06 | subbing layer consisting of a first layer of 85.6% of LATEX01, 9.5% of KIESELSOL ™ 100F, 2.5% of PEDOT/PSS, 0.5% of MERSOLAT ™ 76H and 1.9% ULTRAVON ™ W; and an outermost layer consisting of 49% gelatin, 44% KIESELSOL ™ 300F, 1.72% ULTRAVON ™ W, 0.86% ARKOPAL ™ N060, 2.86% 2-methyl-2,4-pentanediol 1.43% trimethylol propane and 0.13% polymethyl methacylate 3 μm matting agent. |
| 07 | subbing layer consisting of 79.8% LATEX02; 19.9% KIESELSOL ™ 100F; and 0.3% ARKOPON ™ T |
| 08 | subbing layer consisting of 75.0% LATEX01, 9.0% LATEX03 and 16.0% KIESELSOL ™ 100F |

For the corona discharge treatment of polyethylene terephthalate film in air, an AHLBRANDT™ corona treater type 53-02 was used consisting of 2 quartz electrodes, a grounded treater roll and a 15 kHz generator. The air gap between the electrode and film was 1.2 mm and the film was endowed with optimal adhesion properties by transporting it at a speed of 10 m/min under the corona treater at a watt density of 400 Wmin/m².

The glow discharge treatment of polyethylene terephthalate film was carried out in a vacuum system consisting of a reactor vessel, vacuum pumps, a gas inlet, a DC power source and a titanium glow cathode. The operating conditions used were a transport speed of 40 m/min, an air pressure of $10^{-2}$ mbar and a power density of 40 Wmin/m² and a distance between the cathode and film of 100 mm.

Poly(3,4-ethylenedioxythiophene)/poly(styrene Sulphonate) [PEDOT/PSS] Dispersion The aqueous dispersions of PEDOT/PSS in a weight ratio of 1:2.4 used in the EXAMPLES were prepared according to the method described in EP-A-1 079 397. The particle size of the PEDOT/PSS latex was determined by CPS disc centrifuge measurements to be narrow with a maximum at 25 nm with an average particle size of 30–50 nm.

EXAMPLE 1

In EXAMPLE 1, a negative working light-sensitive compound was used for patterning a polythiophene outermost layer. Support nr. 1 was coated on the subbed side with 40 mL/m² (40 μm wet thickness) of the coating dispersion given in Table 1. The compositions of the dried outermost layers are also given in Table 1.

TABLE 1

| | SAMPLE | | | | | | |
|---|---|---|---|---|---|---|---|
| | I (COMP) | II | III | IV | V | VI | VII |
| INGREDIENT [g] | | | | | | | |
| 1.2% aqueous dispersion of PEDOT/PSS | 417 | 417 | 417 | 417 | 417 | 417 | 417 |
| 0.25% aqueous solution of NDP01 | — | 100 | 250 | 500 | — | — | — |
| 0.25% aqueous solution of NDP02 | — | — | — | — | 100 | 250 | 500 |
| LATEX01 | 8.3 | — | — | — | — | — | — |
| 2% aqueous solution of ZONYL ™ FSO 100 | 10 | 10 | 10 | 10 | 10 | 10 | 10 |
| N-methyl-pyrrolidinone | 50 | 50 | 50 | 50 | 50 | 50 | 50 |
| deionized water | 514.7 | 423 | 273 | 23 | 423 | 423 | 423 |
| COVERAGE [mg/m²] | | | | | | | |
| PEDOT/PSS | 200 | 200 | 200 | 200 | 200 | 200 | 200 |
| NDP01 | — | 10 | 25 | 50 | — | — | — |
| NDP02 | — | — | — | — | 10 | 25 | 50 |
| LATEX01 | 100 | — | — | — | — | — | — |
| ZONYL ™ FSO 100 | 8 | 8 | 8 | 8 | 8 | 8 | 8 |

The Samples were exposed through a mask on a PRINTON™ CDL 1502i UV contact exposure unit (from AGFA-GEVAERT N.V.) for 30–75 s at 2 mW/cm² (=exposure of 0.06–0.15 J/cm²) and processed with deionized water. The results are given in Table 2.

TABLE 2

| | SAMPLE | | | | | | |
|---|---|---|---|---|---|---|---|
| PROPERTY | I (COMP) | II | III | IV | V | VI | VII |
| $R_s$ differentiation between exposed and non-exposed areas after processing | no | yes | yes | yes | yes | yes | yes |
| $R_s$ (Ω/square) of coated layer before patterning | 730 | 760 | 650 | 980 | 490 | 620 | 1500 |

TABLE 2-continued

| PROPERTY | SAMPLE | | | | | | |
|---|---|---|---|---|---|---|---|
| | I (COMP) | II | III | IV | V | VI | VII |
| $R_s$ ($\Omega$/square) of the non-exposed areas after exposure and processing | — | $5 \times 10^4$ | $5 \times 10^4$ | $5 \times 10^4$ | $5 \times 10^4$ | $5 \times 10^4$ | $5 \times 10^4$ |
| $R_s$ ($\Omega$/square) of the non-exposed areas after exposure and thorough rubbing during processing | — | $>10^{10}$ | $>10^{10}$ | $>10^{10}$ | $>10^{10}$ | $>10^{10}$ | $>10^{10}$ |
| $R_s$ ($\Omega$/square) of the exposed areas after exposure and processing | 730 | 850 | 650 | 960 | 480 | 630 | 1500 |

The results in Table 2 show that for the samples II to VII according to the invention, structured conducting PEDOT/PSS-containing outermost layers were obtained and that the patterning method of exposure and developing does not substantially affect the conductivity of the outermost layer. After processing the surface a resistivity of the non-exposed areas was above $10^4$ $\Omega$/square. A surface resistivity in the non-exposed areas above $10^{10}$ $\Omega$/square could be obtained when the material was rubbed thoroughly with a tissue during processing.

EXAMPLE 2

In EXAMPLE 2, a negative working light-sensitive compound was used for patterning a polythiophene outermost layer. Support nr. 1 was coated on the subbed side with 40 mL/m$^2$ (40 µm wet thickness) of the coating dispersions given in Table 3 and dried giving the compositions given in Table 3.

TABLE 3 composition of the coating dispersions

| | SAMPLE | | | | | | |
|---|---|---|---|---|---|---|---|
| | VIII (COMP) | IX | X | XI | XII | XIII | XIV |
| INGREDIENT [g] | | | | | | | |
| 1.2% aq. PEDOT/PSS dispersion | 417 | 417 | 417 | 417 | 417 | 417 | 417 |
| 17% solution of NDP03 in isopropanol/water (60/40) | — | 1.5 | 3.7 | 7.1 | 14.2 | 28.4 | 56.8 |
| LATEX01 | 8.3 | — | — | — | — | — | — |
| 2% aq. sol. ZONYL ™ FSO 100 | 10 | 10 | 10 | 10 | 10 | 10 | 10 |
| N-methyl-pyrrolidinone | 50 | 50 | 50 | 50 | 50 | 50 | 50 |
| deionized water | 514.7 | 522 | 519 | 516 | 509 | 495 | 466 |
| COVERAGE | | | | | | | |
| PEDOT/PSS [mg/m$^2$] | 200 | 200 | 200 | 200 | 200 | 200 | 200 |
| NDP03 [mg/m$^2$] | — | 10 | 25 | 50 | 100 | 200 | 400 |
| LATEX01 [mg/m$^2$] | 100 | — | — | — | — | — | — |
| ZONYL ™ FSO 100 | 8 | 8 | 8 | 8 | 8 | 8 | 8 |

The samples were exposed through a mask on a PRINTON™ CDL 1502i UV contact exposure unit (from AGFA-GEVAERT N.V.) for 250 s at 2 mW/cm$^2$ (=exposure of 0.5 J/cm$^2$) and processed in water while rubbing with a tissue under water and the results are presented in Table 4.

TABLE 4

| property | VIII (COMP) | IX | X | XI | XII | XIII | XIV |
|---|---|---|---|---|---|---|---|
| $R_s$ differentiation between exposed and non-exposed areas after processing | no | yes | yes | yes | yes | yes | yes |
| $R_s$ ($\Omega$/square) of coated layer before patterning | 760 | 689 | 739 | 790 | 1100 | 1600 | 5500 |
| $R_s$ ($\Omega$/square) of the non-exposed areas after exposure and processing | — | >$10^5$ | >$10^5$ | >$10^5$ | >$10^5$ | >$10^5$ | >$10^5$ |
| $R_s$ ($\Omega$/square) of the non-exposed areas after exposure and thorough rubbing during processing | — | >$10^{10}$ | >$10^{10}$ | >$10^{10}$ | >$10^{10}$ | >$10^{10}$ | >$10^{10}$ |
| $R_s$ ($\Omega$/square) of exposed areas after exposure and processing | 760 | 1344 | 1375 | 1360 | 2100 | 2400 | 22000 |

The results in Table 4 show that in the samples IX to XIV according to the invention structured conducting PEDOT/PSS-containing outermost layers were obtained. After processing the surface resistivity of the non-exposed areas was above $10^5$ $\Omega$/square. A surface resistivity in the non-exposed areas above $10^{10}$ $\Omega$/square could be obtained when the material was rubbed thoroughly with a tissue during processing.

EXAMPLE 3

In EXAMPLE 3, NDP04, a homopolymer of ADS-MONOMER 01 was incorporated into the PEDOT/PSS-containing outermost layer to realize patterning of a polythiophene outermost layer. Samples XV to XXIV were produced by coating 40 mL/m² of the dispersions given in Table 5 on Support nr. 1 to 8 to a wet thickness of 40 μm. After drying the Samples XV to XXIV had the compositions also given in Table 5.

TABLE 5

| | composition of the coating dispersions | | | | | | | | | |
|---|---|---|---|---|---|---|---|---|---|---|
| | SAMPLE | | | | | | | | | |
| | XV | XVI | XVII | XVIII | XIX | XX | XXI | XXII | XXIII | XXIV |
| INGREDIENT [g] | | | | | | | | | | |
| Support nr. | 1 | 1 | 1 | 2 | 3 | 4 | 5 | 6 | 7 | 8 |
| 1.2% aqueous dispersion of PEDOT/PSS | 417 | 417 | 417 | 417 | 417 | 417 | 417 | 417 | 417 | 417 |
| 17.8% aq. sol. of NDP04 | 7 | 14 | 21 | 14 | 14 | 14 | 14 | 14 | 14 | 14 |
| 2% aqueous solution of ZONYL ™ FSO 100 | 10 | 10 | 10 | 10 | 10 | 10 | 10 | 10 | 10 | 10 |
| N-methyl-pyrrolidinone | 50 | 50 | 50 | 50 | 50 | 50 | 50 | 50 | 50 | 50 |
| deionized water | 516 | 509 | 502 | 509 | 509 | 509 | 509 | 509 | 509 | 509 |
| COVERAGE | | | | | | | | | | |
| PEDOT/PSS [mg/m²] | 200 | 200 | 200 | 200 | 200 | 200 | 200 | 200 | 200 | 200 |
| NDP04 [mg/m²] | 50 | 100 | 150 | 100 | 100 | 100 | 100 | 100 | 100 | 100 |
| ZONYL FSO 100 [mg/m²] | 8 | 8 | 8 | 8 | 8 | 8 | 8 | 8 | 8 | 8 |

The Samples were exposed through a mask on a PRINTON™ CDL 1502i UV contact exposure unit (from AGFA-GEVAERT N.V.) for 200 s at 2 mW/cm² (=exposure of 0.4 J/cm²) and processed in water (softly rubbing with a tissue under water). The results are given in Table 6.

TABLE 6

| PROPERTY | SAMPLE | | | | | | | | | |
|---|---|---|---|---|---|---|---|---|---|---|
| | XV | XVI | XVII | XVIII | XIX | XX | XXI | XXII | XXIII | XXIV |
| Support nr | 1 | 1 | 1 | 2 | 3 | 4 | 5 | 6 | 7 | 8 |
| $R_s$ ($\Omega$/square) of coated layer before patterning | $1.7 \times 10^3$ | $5.2 \times 10^3$ | $1.5 \times 10^4$ | $3.8 \times 10^3$ | $3.8 \times 10^3$ | $1.8 \times 10^5$ | $4.1 \times 10^3$ | $2.5 \times 10^5$ | $4.0 \times 10^3$ | $9.7 \times 10^3$ |
| $R_s$ ($\Omega$/square) of non-exposed areas after exposure and processing | $2.4 \times 10^5$ | $4.2 \times 10^5$ | $6.3 \times 10^5$ | $6.5 \times 10^{12}$ | $6.2 \times 10^{12}$ | $9.9 \times 10^8$ | $3.8 \times 10^{12}$ | $9.0 \times 10^6$ | $9.6 \times 10^5$ | $1.1 \times 10^5$ |
| $R_s$ ($\Omega$/square) of exposed areas after exposure | — | $7.2 \times 10^3$ | — | $5.6 \times 10^3$ | $6.1 \times 10^3$ | $2.4 \times 10^5$ | $6.1 \times 10^3$ | $3.4 \times 10^5$ | $6.9 \times 10^3$ | $2.2 \times 10^4$ |
| $R_s$ ($\Omega$/square) of exposed areas after exposure and processing | $4.8 \times 10^4$ | $1.6 \times 10^4$ | $1.5 \times 10^5$ | $1.2 \times 10^4$ | $1.2 \times 10^4$ | $1.0 \times 10^6$ | $1.1 \times 10^4$ | $1.2 \times 10^6$ | $4.8 \times 10^5$ | $5.1 \times 10^4$ |
| $R_s$ ratio non-exposed/exposed areas | 5 | 26.3 | 4.2 | $5 \times 10^8$ | $5 \times 10^8$ | 990 | $4 \times 10^8$ | 7.5 | 2.0 | 2.2 |

The results given in Table 6 indicate that the concentration of NDP04 in the PEDOT/PSS-containing outermost layer had a considerable effect on the resistance ratio non-exposed/exposed areas observed i.e. on the differentiation after processing between exposed and non-exposed areas, varying in the case of Support nr. 1 from 4 to 26.3.

The results given in Table 6 also indicate that the particular support used had a crucial effect on the resistance ratio non-exposed/exposed areas, i.e. on the differentiation after processing between exposed and non-exposed areas, varying from 2 to $5 \times 10^8$ Particularly high resistance ratios of >10 were observed in the cases of Support nr. 2, 3 and 5 i.e. with supports treated with a corona discharge or a glow discharge or a support in which the particular subbing layer of Support nr. 5 was used. In the cases of samples XV, XVI and XVII coated on Support nr. 1, surface resistivities $>10^7$ $\Omega$/square could be obtained by rubbing thoroughly with a tissue during processing (results not shown in Table 6).

The mask used for exposing the above samples consisted of alternating lines of high and low density, the lines having width down to 6 am. These lines were reproduced very well in the patterned material, which showed conducting lines and non-conducting spaces of similar width.

EXAMPLE 4

In EXAMPLE 4, various copolymers incorporating ADS-MONOMER 01 were incorporated into the PEDOT/PSS-containing outermost layer to realize patterning of a polythiophene outermost layer. Samples XXV to XXX were produced by coating 50 mL m² of the dispersions given in Table 7 on Support nr. 3, a polyethylene terephthalate film treated with a glow discharge to a wet thickness of 50 $\mu$m.

TABLE 7

| | SAMPLE | | | | | |
|---|---|---|---|---|---|---|
| | XXV | XXVI | XXVII | XXVIII | XXIX | XXX |
| INGREDIENT [g] | | | | | | |
| 1.2% aq. PEDOT/PSS dispersion | 16.7 | 16.7 | 16.7 | 16.7 | 16.7 | 16.7 |
| 2% aq. sol. of ZONYL ™ FSO 100 | 0.50 | 0.50 | 0.50 | 0.50 | 0.50 | 0.50 |
| N-methyl-pyrrolidinone | 2.50 | 2.50 | 2.50 | 2.50 | 2.50 | 2.50 |
| 2.5% aqueous NH$_4$OH solution | 0.45 | 0.45 | 0.45 | 0.45 | 0.45 | 0.45 |
| 15.16% aq. solution of NDP06 | 0.66 | — | — | — | — | — |
| 17.03% aq. solution of NDP07* | — | 0.59 | — | — | — | — |
| 18.34% aq. solution of NDP08* | — | — | 0.54 | — | — | — |
| 16.8% ag. solution of NDP09* | — | — | — | 0.59 | — | — |
| 17.39% aq. solution of NDP10* | — | — | — | — | 0.57 | — |
| 16.63% aq. solution of NDP11* | — | — | — | — | — | 0.60 |
| deionized water | 29.19 | 29.26 | 29.31 | 29.26 | 29.28 | 29.25 |
| COVERAGE | | | | | | |
| PEDOT/PSS [mg/m²] | 200 | 200 | 200 | 200 | 200 | 200 |
| NDP06 [mg/m²] | 100 | — | — | — | — | — |
| NDP07 [mg/m²] | — | 100 | — | — | — | — |
| NDP08 [mg/m²] | — | — | 100 | — | — | — |
| NDP09 [mg/m²] | — | — | — | 100 | — | — |
| NDP10 [mg/m²] | — | — | — | — | 100 | — |
| NDP11 [mg/m²] | — | — | — | — | — | 100 |
| ZONYL FSO 100 [mg/m²] | 8 | 8 | 8 | 8 | 8 | 8 |

*solution in water/isopropanol 40/60 by volume

The Samples were exposed through a mask on a PRINTON™ CDL 1502i UV contact exposure unit (from AGFA-GEVAERT N.V.) for 200 s at 4 mW/cm² (=exposure of 0.8 J/cm²) and processed in water (softly rubbing with a tissue under water). The results are given in Table 8.

The results in Table 8 show that Samples XXV to XXX exhibited surface resistivity ratios of non-exposed to exposed areas after processing of greater than 2200.

TABLE 8

| PROPERTY | XXV | XXVI | XXVII | XXVIII | XXIX | XXX |
|---|---|---|---|---|---|---|
| $R_s$ (Ω/square) of coated layer before patterning | $3.2 \times 10^3$ | $4.5 \times 10^3$ | $3.4 \times 10^3$ | $3.8 \times 10^3$ | $3.2 \times 10^3$ | $2.9 \times 10^3$ |
| $R_s$ (Ω/square) of non-exposed areas after exposure and processing | $>4.0 \times 10^7$ | $>4.0 \times 10^7$ | $>4.0 \times 10^7$ | $>4.0 \times 10^7$ | $>4.0 \times 10^7$ | $>4.0 \times 10^7$ |
| $R_s$ (Ω/square) of exposed areas after exposure and processing | $1.5 \times 10^4$ | $1.8 \times 10^4$ | $1.5 \times 10^4$ | $1.5 \times 10^4$ | $1.0 \times 10^4$ | $1.2 \times 10^4$ |
| $R_s$ ratio non-exposed/exposed areas | >2700 | >2200 | >2700 | >2700 | >4000 | >3300 |

EXAMPLE 5

In EXAMPLE 5, Samples XXX1 to XXXIV were prepared by first preparing the dispersions given in Table 9 by adding a solution of a copolymer incorporating ADS-MONOMER 01 and N-methyl-pyrrolidinone to an aqueous PEDOT/PSS-dispersion. 50 mL/m² of these dispersions was then coated onto Support nr. 3, a polyethylene terephthalate film treated with a glow discharge, to a wet thickness of 50 μm and dried to the compositions given in Table 9.

TABLE 9 composition of the coating dispersions

| | XXX1 | XXXII | XXXIII | XXXIV |
|---|---|---|---|---|
| INGREDIENT | | | | |
| 1.2% aq. dispersion of PEDOT/PSS | 16.7 | 16.7 | 16.7 | 16.7 |
| 2% aq. solution of ZONYL™ PSO 100 | 0.50 | 0.50 | 0.50 | 0.50 |
| N-methyl-pyrrolidinone | 2.50 | 2.50 | 2.50 | 2.50 |
| 2.5% aqueous NH₄OH solution | 0.45 | 0.45 | 0.45 | 0.45 |
| 15.16% aq. solution of NDP06 | 0.66 | — | — | — |
| 15.9% aq. solution of NDP12* | — | 0.63 | — | — |
| 15.9% aq. solution of NDP13* | — | — | 0.63 | — |
| 15.9% aq. solution of NDP14* | — | — | — | 0.63 |
| deionized water | 29.19 | 29.22 | 29.22 | 29.22 |
| COVERAGE | | | | |
| PEDOT/PSS [mg/m²] | 200 | 200 | 200 | 200 |
| NDP06 [mg/m²] | 100 | — | — | — |
| NDP12 [mg/m²] | — | 100 | — | — |
| NDP13 [mg/m²] | — | — | 100 | — |
| NDP14 [mg/m²] | — | — | — | 100 |
| ZONYL PSO 100 [mg/m²] | 8 | 8 | 8 | 8 |

*solution in water/isopropanol 40/60 by volume

Since the conductivity-enhancing liquid N-methyl-pyrrolidinone is present in the coating dispersions conductivity enhancement takes place during the coating process resulting in PEDOT/PSS-outermost layers with a lower surface resistivity than such outermost layers prepared in the absence of N-methyl-pyrrolidinone, as taught in EP-A 686 662 and EP-A 1 003 179.

The Samples were exposed through a mask on a PRINTON™ CDL 1502i UV contact exposure unit (from AGFA-GEVAERT N.V.) for 200 s at 4 mW/cm² (=exposure of 0.8 J/cm²) and processed in water (softly rubbing with a tissue under water) and the results are given in Table 10.

The results in Table 10 show that Samples XXXI to XXXIV exhibited surface resistivity ratios of non-exposed to exposed areas after processing of greater than 9000.

TABLE 10

| PROPERTY | XXXI | XXXII | XXXIII | XXXIV |
|---|---|---|---|---|
| $R_s$ (Ω/square) of coated layer before patterning | $2.8 \times 10^3$ | $1.9 \times 10^3$ | $1.6 \times 10^3$ | $1.8 \times 10^3$ |
| $R_s$ (Ω/square) of non-exposed areas after exposure and processing | $>4.0 \times 10^7$ | $>4.0 \times 10^7$ | $>4.0 \times 10^7$ | $1.6 \times 10^8$ |
| $R_s$ (Ω/square) of exposed areas after exposure and processing | $1.0 \times 10^4$ | $3.6 \times 10^3$ | $4.5 \times 10^3$ | $4.2 \times 10^3$ |
| Resistance ratio non-exposed/exposed areas | $>4 \times 10^3$ | $>1.1 \times 10^3$ | $>9 \times 10^3$ | $3.8 \times 10^4$ |
| Optical resolution of lines [μm] | 8 | 4 | 40 | 4 |
| Optical resolution of spaces μm] | >70 | 6 | 6 | 6 |

EXAMPLE 6

In EXAMPLE 6, Samples XXXV to XL were prepared by first preparing the dispersions given in Table 11 by adding a solution of a copolymer incorporating ADS-MONOMER 01 to an aqueous PEDOT/PSS-dispersion. 40 mL/m² of these dispersions was then coated onto Support nr. 3, a polyethylene terephthalate film treated with a glow discharge to a wet thickness of 40 μm and dried. Since no conductivity-enhancing liquid is present in the coating dispersions, no conductivity enhancement takes place during the coating process resulting in PEDOT/PSS-containing outermost layers with a higher surface resistivity than would otherwise have been the case.

TABLE 11 composition of the coating dispersions

| | SAMPLE | | | | | |
|---|---|---|---|---|---|---|
| | XXXV | XXXVI | XXXVII | XXXVIII | XXXIX | XL |
| INGREDIENT [g] | | | | | | |
| 1.2% aq. PEDOT/PSS dispersion | 16.7 | 16.7 | 16.7 | 16.7 | 16.7 | 16.7 |
| 2% aq. sol. ZONYL ™ FSO 100 | 0.50 | 0.50 | 0.50 | 0.50 | 0.50 | 0.50 |
| 2.5% aqueous NH$_4$OH solution | 0.50 | 0.50 | 0.50 | 0.50 | 0.50 | 0.50 |
| 15.9% solution of NDP15* | 0.63 | — | — | — | — | — |
| 17.6% solution of NDP20* | — | 0.57 | — | — | — | — |
| 17.4% solution of NDP21* | — | — | 0.58 | — | — | — |
| 14.02% solution of NDP23* | — | — | — | 0.72 | — | — |
| 14.36% solution of NDP27* | — | — | — | — | 0.70 | — |
| 18.81% solution of NDP32* | — | — | — | — | — | 0.53 |
| deionized water | 31.67 | 31.73 | 31.72 | 31.58 | 31.60 | 31.77 |
| COVERAGE | | | | | | |
| PEDOT/PSS [mg/m$^2$] | 200 | 200 | 200 | 200 | 200 | 200 |
| NDP15 [mg/m$^2$] | 100 | — | — | — | — | — |
| NDP20 [mg/m$^2$] | — | 100 | — | — | — | — |
| NDP21 [mg/m$^2$] | — | — | 100 | — | — | — |
| NDP23 [mg/m$^2$] | — | — | — | 100 | — | — |
| NDP27 [mg/m$^2$] | — | — | — | — | 100 | — |
| NDP32 [mg/m$^2$] | — | — | — | — | — | 100 |
| ZONYL FSO 100 [mg/m$^2$] | 8 | 8 | 8 | 8 | 8 | 8 |

*solution in water/isopropanol 40/60 by volume

The Samples were exposed through a mask on a PRINTON™ CDL 1502i UV contact exposure unit (from AGFA-GEVAERT N.V.) for 100 s at 4 mW/cm$^2$ (=exposure of 0.4 J/cm$^2$) and processed by dipping and moving gently in water (processing liquid A) or a 2.5% by weight aqueous ammonia solution at 25° C. water (processing liquid B), rinsing with deionized water and dried at 50° C. for 4 minutes. The results are given in Table 12.

The samples were then subjected to conductivity enhancement by treatment for 1 minute in a 10% aqueous solution of diethylene glycol, a conductivity enhancing liquid, at 25° C. followed by drying at 110° C. for 20 minutes. The surface resistivity of the exposed and unexposed areas were then remeasured. The enhanced surface resistivity values are given in Table 12.

TABLE 12

| | SAMPLE | | | | | |
|---|---|---|---|---|---|---|
| PROPERTY | XXXV | XXXVI | XXXVII | XXXVIII | XXXIX | XL |
| processing liquid | B | B | B | A | A | A |
| R$_s$(Ω/square) of coated layer before patterning | 7.5 × 10$^6$ | 3.4 × 10$^6$ | 1.9 × 10$^6$ | 4.5 × 10$^6$ | 6.5 × 10$^6$ | 8.0 × 10$^6$ |
| R$_s$(Ω/square) of non-exposed areas after exposure and processing | >4.0 × 10$^7$ | >4.0 × 10$^7$ | 8.6 × 10$^6$ | >4.0 × 10$^7$ | >4.0 × 10$^7$ | >4.0 × 10$^7$ |
| R$_s$(Ω/square) of exposed areas after exposure and processing | 4.5 × 10$^6$ | 2.1 × 10$^6$ | 8.2 × 10$^6$ | 5.7 × 10$^6$ | 2.7 × 10$^6$ | 4.0 × 10$^6$ |
| R$_s$ ratio non-exposed/exposed areas | >8.9 | >19.0 | 1.0 | >7.0 | >14.8 | >10 |
| Optical resolution of lines [μm] | 4 | 4 | 4 | 4 | 4 | 4 |
| Optical resolution of spaces [μm] | 6 | 6 | 6 | 6 | 6 | 4 |
| R$_s$(Ω/square) of non-exposed areas after processing and enhancement | 9.0 × 10$^8$ | 1.2 × 10$^9$ | 1.1 × 10$^7$ | 4.3 × 10$^{12}$ | 5.4 × 10$^{10}$ | 4.5 × 10$^{12}$ |
| R$_s$(Ω/square) of exposed areas after exposure, processing and enhancement | 9.1 × 10$^3$ | 9.5 × 10$^3$ | 2.7 × 10$^4$ | 3.8 × 10$^4$ | 4.0 × 10$^3$ | 5.9 × 10$^3$ |
| R$_s$ ratio non-exposed/exposed areas after enhancement | 9.9 × 10$^4$ | 1.3 × 10$^5$ | 400 | 1.13 × 10$^8$ | 1.35 × 10$^7$ | 7.6 × 10$^8$ |

EXAMPLE 6 showed that similar resistance ratio of non-exposed/exposed areas can be achieved starting from non-conductivity enhanced PEDOT/PSS-containing outermost layers as from conductivity enhanced PEDOT/PSS-containing outermost layers (see EXAMPLE 5), provided that the structured outermost layers are post-treated with a conductivity enhancing liquid followed by drying/tempering at an appropriate temperature. It should be, however, pointed out that post-treatment with a conductivity enhancing liquid will also enhance the conductivity of any PEDOT/PSS remaining in the non-exposed areas should the removal be incomplete.

EXAMPLE 7

Samples VIII, IX, X, XI and XII of EXAMPLE 2 were image-wise exposed in heat-mode with a NdYAG laser (1064 nm) having a spot size of 22 μm, a pitch of 11 Am and a scan speed of 2 m/s. The image plane power was set at 100 mW. The exposed samples were processed in water (softly rubbing with a tissue under water).

For the samples IX, X, XI and XII structured PEDOT/PSS-containing outermost layers s were obtained having a similar surface resistivity as in EXAMPLE 2. For sample VIII (comparative example) no structured conducting PEDOT/PSS-containing outermost layer was obtained, since the PEDOT/PSS-containing outermost layer was removed in the non-exposed as well as in the exposed areas. The surface resistivity of the non-exposed areas was above $10^4$ Ω/square. A surface resistivity in the non-exposed areas above $10^{10}$ Ω/square could be obtained when the material was rubbed thoroughly with a tissue during processing.

EXAMPLE 8

Samples VIII, IX, X, XI and XII of EXAMPLE 2 were image-wise exposed in heat-mode with a diode laser (830 nm) having a spot size of 11 am, a pitch of 6 μm and a scan speed of 2 m/s. The image plane power was set at 81 mW. The exposed samples were processed in water (softly rubbing with a tissue under water). The results were similar to those obtained in EXAMPLE 7.

EXAMPLE 9

EXAMPLE 9, a positive working light-sensitive compound was used for patterning a polythiophene outermost layer. Support nr. 1 was first coated with a solution of PQD01 in methylethylketone (1:2 volume:volume) (15 μm wet thickness). Samples XLI and XLII were prepared by coating this PQD01 layer with the PEDOT/SS-containing dispersions given in Table 13 to a 67 μm wet thickness and drying. The PEDOT/PSS-containing outermost layers of Samples XLI and XLII contained 100 and 400 of PEDOT/PSS respectively.

TABLE 13 composition of PEDOT/PSS-containing coating dispersions

| | SAMPLE | |
|---|---|---|
| | XLI | XLII |
| INGREDIENT [g] | | |
| 1.2% aqueous dispersion of PEDOT/PSS | 125 | 500 |
| Z6040 | 1.0 | 1.0 |
| 2% aqueous solution of ZONYL ™ FSO 100 | 1.5 | 1.5 |

TABLE 13-continued composition of PEDOT/PSS-containing coating dispersions

| | SAMPLE | |
|---|---|---|
| | XLI | XLII |
| N-methyl-pyrrolidinone | 50 | 50 |
| deionized water | 825 | 450 |
| COVERAGE [mg/m²] | | |
| PEDOT/PSS | 100 | 400 |
| ZONYL ™ FSO 100 | 2 | 8 |

Sample XLI was exposed from the PEDOT/PSS-containing layer side of the support and Sample XLII from the uncoated side of the support each through a mask with a PRINTON CDL 1502i UV contact exposure unit for 80 s at 4 mW/cm² (=exposure of 0.32 J/cm²) and processed with AZ303 (CLARIANT) for 80 s. Image-wise structured conducting PEDOT/PSS-containing outermost layers were obtained. The patterning method of exposure and developing did not affect the conductivity of the outermost layer. The surface resistivity of the non-exposed areas was $1.6 \times 10^4$ Ω/square in the case of Sample XLI and $1.2 \times 10^3$ Ω/square in the case of Sample XLII. A surface resistivity in the exposed areas above $10^{10}$ Ω/square could be obtained when the material was rubbed thoroughly with a tissue during processing. Resolutions of 20 μm and 50 μm were obtained with Samples XLI and XLII respectively.

EXAMPLE 10

In EXAMPLE 10, a positive photo-sensitive compound and the electroconductive polymer were present in the same layer. Support nr. 1 was coated with 50 mL m² of the following coating dispersion (Table 14) (50 μm wet thickness).

TABLE 14 composition of the coating dispersions

| INGREDIENT | SAMPLE XLIII |
|---|---|
| 1.2% aqueous dispersion of PEDOT/PSS | 300 |
| PQD01 | 100 |
| 1% aqueous solution of ZONYL ™ FSO 100 | 40 |
| N-methyl-pyrrolidinone | 560 |

The samples were exposed through a mask on a PRINTON CDL 1502i UV contact exposure unit (from AGFA-GEVAERT N.V.) for 60 s at 4 mW/cm² (=exposure of 0.24 J/cm²) and processed with AZ351B (CLARIANT). Image-wise structured conducting PEDOT/PSS-containing outermost layers were obtained. The surface resistivity of the non-exposed areas after development was $10^4$ Ω/square. A surface resistivity in the exposed areas above $10^{10}$ Ω/square could be obtained when the material was rubbed thoroughly with a tissue or through a high pressure jet. A resolution of 6 m was obtained.

EXAMPLE 11

In EXAMPLE 11, BADS01 and BADS02, negative working light-sensitive bis(aryldiazosulphonate) salts, were used for patterning the light-exposure differentiable elements. Samples XLIV to L were prepared by coating Support nr. 3 with 40 mL/m (40 μm wet thickness) of the coating dispersions given in Table 15, which did not contain a conductivity enhancing liquid.

areas, which vary with BADS01 concentration. The highest surface conductivity ratio prior to conductivity enhancement

TABLE 15

|  | SAMPLE | | | | | | |
| --- | --- | --- | --- | --- | --- | --- | --- |
|  | XLIV | XLV | XLVI | XLVII | XLVIII | XLIX | L |
| INGREDIENT [g] | | | | | | | |
| 1.2% aqueous dispersion of PEDOT/PSS | 41.7 | 41.7 | 41.7 | 41.7 | 41.7 | 41.7 | 41.7 |
| 2% aqueous solution of ZONYL ™ FSO 100 | 1 | 1 | 1 | 1 | 1 | 1 | 1 |
| N-methyl-pyrrolidinone | — | — | — | — | — | — | — |
| BADS01 | — | 0.125 | 0.25 | 0.25 | 0.375 | 0.50 | — |
| BADS02 | — | — | — | — | — | — | 0.25 |
| deionized water | 57.30 | 57.18 | 57.05 | 57.05 | 56.93 | 56.80 | 57.05 |
| COVERAGE | | | | | | | |
| PEDOT/PSS [mg/m$^2$] | 200 | 200 | 200 | 200 | 200 | 200 | 200 |
| BADS01 [mg/m$^2$] | — | 50 | 100 | 100 | 150 | 200 | 100 |
| % by weight of BADS01 w.r.t. PEDOT/PSS | 0 | 25 | 50 | 50 | 75 | 100 | — |
| ZONYL ™ FSO 100 [mg/m$^2$] | 8 | 8 | 8 | 8 | 8 | 8 | 8 |

The samples were exposed through a mask on a PRINTON™ CDL 1502i UV contact exposure unit (from AGFA-GEVAERT N.V.) for 400 s at 4 mW/cm$^2$ (=exposure of 1.6 J/cm$^2$) and rinsed with deionized water and dried at 50° C. for 4 minutes. The surface resistivities of the non-exposed and exposed areas of the light-exposure differentiable element before and after rinsing with water and drying are given in Table 16.

of $3.4 \times 10^9$ was observed for 100% by weight of BADS01 with respect to PEDOT/PSS (200 mg/m$^2$ BADS01).

Conductivity enhancement reduced the surface resistivity of the exposed areas by up to a factor of 700, the amount of enhancement decreasing with increasing BADS01 concentration indicating the conductivity enhancing properties of BADS01.

TABLE 16

|  | SAMPLE | | | | | | |
| --- | --- | --- | --- | --- | --- | --- | --- |
|  | XLIV | XLV | XLVI | XLVII | XLVIII | XLIX | L |
| BADS01 [mg/m$^2$] | — | 50 | 100 | 100 | 150 | 200 | — |
| $R_s$ of non-exposed layer untreated with water [Ω/square] | $3.3 \times 10^6$ | $1.5 \times 10^6$ | $6.2 \times 10^4$ | $4.5 \times 10^4$ | $6.9 \times 10^3$ | $1.1 \times 10^4$ | $2.7 \times 10^6$ |
| $R_s$ of non-exposed layer rinsed with water [Ω/square] | $4.7 \times 10^8$ | $1.1 \times 10^9$ | $1 \times 10^{12}/$ $1.3 \times 10^{14}$ | $5.0 \times 10^{12}/$ $7.3 \times 10^{13}$ | $1.0 \times 10^{13}$ | $1.4 \times 10^{14}$ | $2.5 \times 10^{14}$ |
| $R_s$ of exposed layer untreated with water [Ω/square] | $3.0 \times 10^6$ | $1.1 \times 10^6$ | $1.7 \times 10^5$ | $9.0 \times 10^4$ | $2.6 \times 10^4$ | $3.7 \times 10^4$ | $1.0 \times 10^7$ |
| $R_s$ of exposed layer rinsed with water [Ω/square] | $3.5 \times 10^8$ | $9.7 \times 10^5$ | $1.5 \times 10^5$ | $9.9 \times 10^4$ | $4.1 \times 10^4$ | $4.1 \times 10^4$ | $3.6 \times 10^8$ |
| ratio of exposed layer to unexposed layer after rinsing with water | 1.3 | 1134 | $7 \times 10^6/$ $9 \times 10^8$ | $5 \times 10^7/$ $7.3 \times 10^9$ | $2.4 \times 10^8$ | $3.4 \times 10^9$ | $6.9 \times 10^6$ |
| $R_s$ of exposed layer after rinsing with water [Ω/square] and conductivity enhancement | — | $1.4 \times 10^3$ | $1.6 \times 10^3$ | $1.7 \times 10^3$ | $3.3 \times 10^3$ | $2.7 \times 10^3$ | $1.0 \times 10^6$ |

It was notable that a low surface resistivity was achieved with all the Samples containing BADS01, without the use of a conductivity enhancement treatment. No rubbing was necessary to remove the unexposed areas.

The results in Table 16 show that Samples XLIV to XLIX exhibited differential surface resistivity between the exposed and unexposed areas of the surface of light-differentiable element containing BADS01 prior to conductivity enhancement with surface resistivity ratios of exposed to unexposed The differential surface conductivity realized with Sample L, whose light-differentiable element containing BADS02 was comparable with that achieved with Samples XLV to XLIX, but the conductivity enhancement with Sample L was markedly lower than for Samples XLV to XLIX.

EXAMPLE 12

EXAMPLE 12 differed from EXAMPLE 11 in that ammonia was incorporated to improve the stability of the PEDOT/PSS-containing outermost layer. Support nr. 3 was coated with 40 mL/m² (400 μm wet thickness) of the coating dispersions given in Table 17.

TABLE 17

|  | SAMPLE | | |
|---|---|---|---|
|  | LI (COMP) | LII | LIII |
| INGREDIENT [g] | | | |
| 1.2% aq. PEDOT/PSS dispersion | 41.7 | 41.7 | 41.7 |
| 2% aq. sol. of ZONYL ™ FSO 100 | 1 | 1 | 1 |
| N-methyl-pyrrolidinone | — | — | — |
| BADS01 | — | 0.125 | 0.25 |
| 2.5% aqueous NH₄OH solution | 2.28 | 2.48 | 2.33 |
| deionized water | 55.02 | 54.70 | 54.72 |
| COVERAGE | | | |
| PEDOT/PSS [mg/m²] | 200 | 200 | 200 |
| BADS01 [mg/m²] | — | 50 | 100 |
| ZONYL ™ FSO 100 [mg/m²] | 8 | 8 | 8 |

The samples were exposed through a mask on a PRINTON™ CDL 1502i UV contact exposure unit (from AGFA-GEVAERT N.V.) for 250 s at 4 mW/cm² (=exposure of 1.0 J/cm²) and rinsed with deionized water and dried at 50° C. for 4 minutes. The surface resistivities of the non-exposed and exposed areas of the light-exposure differentiable element before and after rinsing with water and drying are given in Table 18.

The results in Table 18 show that Samples LII and LIII exhibited differential surface resistivity between the exposed and unexposed areas of the surface of light-differentiable element containing BADS01 prior to conductivity enhancement with surface resistivity ratios of exposed to unexposed areas, which vary with BADS01 concentration. The highest surface conductivity ratio prior to conductivity enhancement of $4.4 \times 10^8$ was observed for 100 mg/m² BADS01.

Conductivity enhancement reduced the surface conductivity of the exposed areas by up to a factor of 700, the amount of enhancement decreasing with increasing BADS01 concentration indicating the conductivity enhancing properties of BADS01.

TABLE 18

|  | SAMPLE | | |
|---|---|---|---|
|  | LI (COMP) | LII | LIII |
| $R_s$ of non-exposed layer un-rinsed with water [Ω/square] | $3.2 \times 10^6$ | $1.4 \times 10^6$ | $6.3 \times 10^4$ |
| $R_s$ of non-exposed layer rinsed with water [Ω/square] | $1.5 \times 10^{10}$ | $7.1 \times 10^{11}$ | $2.0 \times 10^{14}$ |
| $R_s$ of exposed layer unrinsed with water [Ω/square] | $3.0 \times 10^6$ | $4.8 \times 10^6$ | $4.5 \times 10^5$ |
| $R_s$ of exposed layer rinsed with water [Ω/square] | $7.9 \times 10^{14*}$ | $2.0 \times 10^6$ | $4.5 \times 10^5$ |
| $R_s$ ratio for exposed layer to unexposed layer after rinsing with water | — | $3.6 \times 10^5$ | $4.4 \times 10^8$ |
| Optical resolution [μm] | none | 4–6 | 4–6 |
| bubbles in surface of large exposed areas | — | yes | yes |
| surface resistivity of exposed layer treated with water [Ω/square] and conductivity enhanced | — | $1.4 \times 10^3$ | $2.1 \times 10^3$ |

*exposed layer removed

EXAMPLE 13

In EXAMPLE 13, NDP33, a negative working light-sensitive copolymer, was combined with BADS01 or BADS03, a negative working bis(aryldiazosulphonate,) salt, and BADS03 alone were used for patterning a polythiophene outermost layer. Samples LIV to LVII were prepared by coating Support nr. 3 coated with 50 mL/m² (50 μm wet thickness) of the coating dispersions given in Table 19, which did not contain a conductivity enhancing liquid.

TABLE 19 composition of the coating dispersions

|  | SAMPLE | | | |
|---|---|---|---|---|
|  | LIV | LV | LVI | LVII |
| INGREDIENT [g] | | | | |
| 1.2% aq. dispersion of PEDOT/PSS | 16.7 | 16.7 | 16.7 | 16.7 |
| 1% solution of BADS01 | 7.5 | — | — | — |
| 1% solution of BADS03 | — | 7.5 | 9.0 | 10.0 |
| 2.5% aqueous NH₄OH solution | 1.1 | 1.0 | 0.8 | 1.0 |
| 15.9% solution of NDP33 in water/isopropanol 40/60 by volume | 0.16 | 0.16 | 0.38 | — |
| 2% aq. solution of ZONYL ™ FSO 100 | 0.5 | 0.5 | 0.5 | 0.5 |
| N-methyl-pyrrolidinone | — | — | — | — |
| deionized water | 24.04 | 24.14 | 22.63 | 21.8 |
| pH | 3.71 | 3.85 | 3.65 | 3.67 |
| COVERAGE [mg/m²] | | | | |
| PEDOT/PSS | 200 | 200 | 200 | 200 |
| BADS01 | 75 | — | — | — |
| BADS03 | — | 75 | 90 | 100 |
| NDP33 | 25 | 25 | 60 | — |
| ZONYL FSO 100 | 10 | 10 | 10 | 10 |

The samples were exposed through a mask on a PRINTON™ CDL 1502i UV contact exposure unit (from AGFA-GEVAERT N.V.) for 150 s at 4 mW/cm (=exposure of 0.6 J/cm²) and processed by dipping and moving gently in a 2.5% by weight aqueous ammonia solution at 25° C. water, rinsing with deionized water, drying at 50° C. for 4 minutes, treating with a 10% aqueous diethylene glycol solution for 1 minute thereby upgrading the conductivity and finally drying for 10 minutes at 110° C. The results are given in Table 20.

The results in Table 20 show that in the samples LIV to LVII according to the invention structured conducting PEDOT/PSS-containing outermost layers were obtained. The surface resistivity of the non-exposed areas was below $10^5$ Ω/square and that of the non-exposed areas was $>10^{13}$ Ω/square. The highest R, ratio non-exposed/exposed areas after conductivity upgrading was observed for Sample LVI and LVII with a combination of BADS03 and NPD33; and only BADS03 respectively.

Unlike EXAMPLES 11 and 12 in which excellent $R_s$ ratio non-exposed/exposed areas were also observed after conductivity upgrading with BADS01 but bubbles were observed in the exposed areas, the use of a combination of the ADS-MONOMER 01-copolymer NDP33 and BADS01 produced no bubbles in the exposed areas. This is attributed to the use of a combination of BADS01 and a ADS-MONOMER 01.

TABLE 20

| PROPERTY | SAMPLE | | | |
|---|---|---|---|---|
| | LIV | LV | LVI | LVII |
| Differentiation after processing between exposed and non-exposed areas | YES | YES | YES | YES |
| $R_s$ ($\Omega$/square) of coated layer before patterning | $9.3 \times 10^6$ | $1.3 \times 10^7$ | $1.5 \times 10^7$ | $1.6 \times 10^7$ |
| $R_s$ ($\Omega$/square) of large non-exposed areas after conductivity upgrading | $3.1 \times 10^{13}$ | $4.0 \times 10^{13}$ | $5.0 \times 10^{14}$ | $5.0 \times 10^{14}$ |
| $R_s$ ($\Omega$/square) of large exposed areas after exposure, processing and conductivity upgrading | $3.3 \times 10^3$ | $5.5 \times 10^3$ | $4.1 \times 10^3$ | $3.3 \times 10^3$ |
| $R_s$ ratio non-exposed/exposed areas after conductivity upgrading | $9.4 \times 10^9$ | $7.3 \times 10^9$ | $1.2 \times 10^{11}$ | $1.5 \times 10^{11}$ |
| optical resolution | 4 $\mu$m | 4 $\mu$m | 4 $\mu$m | 4 $\mu$m |

EXAMPLE 14

In EXAMPLE 14, NDP15, a negative working light-sensitive copolymer, was combined with BADS01, a negative working bis(aryldiazosulphonate) compound, was used for patterning the light-exposure differentiable element. Samples LVIII to LXII were prepared by coating Support nr. 3 with 40 mL/m$^2$ (40 $\mu$m wet thickness) of the coating dispersions given in Table 21, which did not contain a conductivity enhancing liquid.

TABLE 21 composition of the coating dispersions

| | SAMPLE | | | | |
|---|---|---|---|---|---|
| INGREDIENT [g] | LVIII | LIX | LX | LXI | LXII |
| 1.2% aq. dispersion of PEDOT/PSS | 41.7 | 41.7 | 41.7 | 41.7 | 41.7 |
| 2% aq. solution of ZONYL ™ FSO 100 | 1 | 1 | 1 | 1 | 1 |
| BADS01 | 0.125 | 0.15 | 0.175 | 0.2 | 0.225 |
| 15.9% sol. of NDP15 in water/isopropanol (40/60 by volume) | 7.86 | 6.3 | 4.7 | 3.14 | 1.471 |
| N-methyl-pyrrolidinone | — | — | — | — | — |
| 2.5% aqueous NH$_4$OH solution | 1.24 | 1.24 | 1.24 | 1.24 | 1.24 |
| deionized water | 48.08 | 49.16 | 51.19 | 52.72 | 54.36 |
| pH | 3.25 | 3.34 | 3.38 | 3.1 | 3.28 |
| COVERAGE [mg/m$^2$] | | | | | |
| PEDOT/PSS | 200 | 200 | 200 | 200 | 200 |
| BADS01 | 50 | 60 | 70 | 80 | 90 |
| NDP15 | 50 | 40 | 30 | 20 | 9 |
| ZONYL FSO 100 | 8 | 8 | 8 | 8 | 8 |

The samples were exposed through a mask on a PRINTON™ CDL 1502i UV contact exposure unit (from AGFA-GEVAERT N.V.) for 400 s at 4 mW/cm$^2$ (=exposure of 1.6 J/cm$^2$) and processed by dipping and moving gently in a 2.5% by weight aqueous ammonia solution at 25° C. water, rinsing with deionized water, drying at 50° C. for 4 minutes, treating with a 10% aqueous diethylene glycol solution for 1 minute thereby upgrading the conductivity and finally drying for 10 minutes at 110° C. The results are given in Table 22.

TABLE 22

| PROPERTY | SAMPLE | | | | |
|---|---|---|---|---|---|
| | LVIII | LIX | LX | LXI | LXII |
| Differentiation after processing between exposed and non-exposed areas | YES | YES | YES | YES | YES |
| $R_s$ ($\Omega$/square) of coated layer before patterning | $1.3 \times 10^7$ | $1.1 \times 10^7$ | $4.1 \times 10^6$ | $4.1 \times 10^6$ | $9.1 \times 10^5$ |
| $R_s$ ($\Omega$/square) of large non-exposed areas after conductivity upgrading | $5.2 \times 10^{15}$ | $2.6 \times 10^{15}$ | $1.5 \times 10^{15}$ | $2.0 \times 10^{15}$ | $5.8 \times 10^{15}$ |
| $R_s$ ($\Omega$/square) of exposed areas after exposure, processing and conductivity upgrading | $1.8 \times 10^3$ | $3.2 \times 10^3$ | $1.4 \times 10^3$ | $1.9 \times 10^3$ | $3.6 \times 10^3$ |
| $R_s$ ratio non-exposed/exposed areas after conductivity upgrading | $2.9 \times 10^{12}$ | $8.1 \times 10^{11}$ | $1.1 \times 10^{12}$ | $1.1 \times 10^{12}$ | $1.6 \times 10^{12}$ |
| bubbles in large areas? | no | no | no | yes | yes |

The results in Table 22 show that in the samples LVIII to LXII according to the invention structured conducting PEDOT/PSS-containing outermost layers were obtained. The surface resistivity of the non-exposed areas was below $10^4$ $\Omega$/square and that of the non-exposed areas was $>10^{15}$ $\Omega$/square. The highest $R_s$ ratio non-exposed/exposed areas after conductivity upgrading, $2.9 \times 10^{12}$, was observed for Sample LVIII.

As with EXAMPLE 13 in which excellent $R_s$ ratio non-exposed/exposed areas were also observed after conductivity upgrading with a combination of an ADS-MONOMER 01-copolymer and BADS01, no bubbles were observed in large exposed areas for certain of the Samples: Samples LVIII, LIX and LX.

EXAMPLE 15

In EXAMPLE 15, NDP15, a negative working light-sensitive copolymer, was combined with BADS01, a negative working bis(aryldiazosulphonate) compound, was used for patterning the light-exposure differentiable element. Samples LXIII to LXVII were prepared by coating Support nr. 3 with 50 mL/m (50 $\mu$m wet thickness) of the coating dispersions given in Table 23, which did not contain a conductivity enhancing liquid.

TABLE 23 composition of the coating dispersions

| | SAMPLE | | | | |
|---|---|---|---|---|---|
| INGREDIENT [g] | LXIII | LXIV | LXV | LXVI | LXVII |
| 1.2% aq. dispersion of PEDOT/PSS | 16.7 | 16.7 | 16.7 | 16.7 | 16.7 |
| 2% aq. solution of ZONYL ™ FSO 100 | 0.5 | 0.5 | 0.5 | 0.5 | 0.5 |
| 2.5% aqueous NH$_4$OH solution | 0.5 | 0.5 | 0.5 | 0.5 | 0.5 |
| 1% aq. solution of BADS01 | — | 2.5 | 5.0 | 7.5 | 10.0 |
| 15.9% solution of NDP15 water/isopropanol 40/60 by volume | 0.63 | 0.47 | 0.32 | 0.16 | — |
| N-methyl-pyrrolidinone | — | — | — | — | — |
| deionized water | 31.7 | 29.3 | 27.0 | 24.6 | 22.3 |
| pH | 3.3 | 3.3 | 3.3 | 3.3 | 3.3 |
| COVERAGE [mg/m$^2$] | | | | | |
| PEDOT/PSS | 200 | 200 | 200 | 200 | 200 |
| BADS01 | 0 | 25 | 50 | 75 | 100 |

TABLE 23-continued composition of the coating dispersions

| | SAMPLE | | | | |
|---|---|---|---|---|---|
| | LXIII | LXIV | LXV | LXVI | LXVII |
| NDP15 | 100 | 75 | 50 | 25 | 0 |
| ZONYL FSO 100 | 10 | 10 | 10 | 10 | 10 |

The samples were exposed through a mask on a PRINTON™ CDL 1502i UV contact exposure unit (from AGFA-GEVAERT N.V.) at 4 mW/cm$^2$ for the exposure times given in Table 24 and processed by dipping and moving gently in a 2.5% by weight aqueous ammonia solution at 25° C. water, rinsing with deionized water, drying at 50° C. for 4 minutes, treating with a 10% aqueous diethylene glycol solution for 1 minute thereby upgrading the conductivity and finally drying for 10 minutes at 110° C. The results are given in Table 24.

TABLE 24

| | SAMPLE | | | | |
|---|---|---|---|---|---|
| PROPERTY | LXIII | LXIV | LXV | LXVI | LXVII |
| Exposure time [s] | 100 | 100 | 100 | 100 | 300 |
| Differentiation after processing between exposed and non-exposed areas | YES | YES | YES | YES | YES |
| $R_s$ (Ω/square) of coated layer before patterning | 9.0 × 10$^6$ | 1.1 × 10$^7$ | 1.4 × 10$^7$ | 9.0 × 10$^6$ | 1.0 × 10$^6$ |
| $R_s$ (Ω/square) of large non-exposed areas after processing and conductivity upgrading | 1.7 × 10$^7$ | 1.5 × 10$^6$ | 1.2 × 10$^5$ | 5.5 × 10$^{14}$ | 3.5 × 10$^{14}$ |
| $R_s$ (Ω/square) of exposed areas after exposure, processing and conductivity upgrading | 1.4 × 10$^4$ | 8.2 × 10$^3$ | 5.5 × 10$^3$ | 7.4 × 10$^3$ | 7.8 × 10$^3$ |
| $R_s$ ratio non-exposed/exposed areas after conductivity upgrading | 1.2 × 10$^3$ | 1.8 × 10$^2$ | 1.1 × 10$^2$ | 7.4 × 10$^{10}$ | 4.5 × 10$^{10}$ |
| Optical resolution of lines [μ] | 4 | 4 | 4 | 4 | 4 |
| Optical resolution of spaces [μ] | 4 | 4 | 4 | 4 | 4 |
| bubbles in large areas? | no | no | no | no | yes |

The results in Table 24 show that in the samples LXIII to LXVII according to the invention structured conducting PEDOT/PSS-containing outermost layers were obtained. The surface resistivity of the non-exposed areas was below 2×10$^4$ Ω/square and that of the non-exposed areas varied considerably from 10$^5$ to 10$^7$ Ω/square for Samples LXIII to LXV to >10$^{14}$ Ω/square for Samples LXVI and LXVII. The highest $R_s$ ratio non-exposed/exposed areas after conductivity upgrading, 7.4×10$^{10}$, was observed for Sample LXVI.

Only in the case of Sample LXVII were bubbles observed in large exposed areas.

EXAMPLE 16

EXAMPLE 16, discloses the negative patterning performance of different layer configurations on Support nr. 1 and Support nr. 3. The compositions of the layers are given in Table 25.

TABLE 25

| | SAMPLE | | | | | | |
|---|---|---|---|---|---|---|---|
| | LXVIII | LXIX | LXX | LXXI | LXXII | LXXIII | LXXIV |
| Support nr. | 1 | 1 | 1 | 1 | 3 | 3 | 3 |
| LAYER 1 | | | | | | | |
| NDP04 [mg/m$^2$] | 100 | 100 | 100 | 100 | 100 | 100 | 100 |
| OUTERMOST LAYER 2 [mg/m$^2$] | | | | | | | |
| PEDOT/PSS | 200 | 200 | 200 | 200 | 200 | 200 | 200 |
| Z6040 | 200 | 70 | — | — | 200 | 70 | — |
| NDP04 | — | — | — | 100 | — | — | 100 |
| N-methyl-pyrrolidinone | 2500 | 2500 | 2500 | — | 2500 | 2500 | 2500 |

The samples were exposed through a mask on a PRINTON™ CDL 1502i UV contact exposure unit (from AGFA-GEVAERT N.V.) at 4 mW/cm$^2$ for the times given in Table 26 and processed by rinsing with deionized water. The surface resistivities of the non-exposed and exposed areas of the light-exposure differentiable element before and after rinsing with deionized water are given in Table 26. Only in the case of Sample LXXI was rubbing with a soft tissue under water unnecessary.

TABLE 26

| | SAMPLE | | | | | | |
|---|---|---|---|---|---|---|---|
| | LXVIII | LXIX | LXX | LXXI | LXXII | LXXIII | LXXIV |
| Support nr. | 1 | 1 | 1 | 1 | 3 | 3 | 3 |
| Exposure times [s] | 100 | 150 | 150 | 100 | 100 | 150 | 150 |
| $R_s$ of non-exposed areas unrinsed with water [Ω/square] | $1.2 \times 10^4$ | $4.2 \times 10^3$ | $6.0 \times 10^3$ | $2.6 \times 10^7$ | $1.5 \times 10^4$ | $3.0 \times 10^3$ | $3.2 \times 10^5$ |
| $R_s$ of non-exposed areas rinsed with water [Ω/square] | $6.2 \times 10^{12}$ | $>4.0 \times 10^7$ | $>4.0 \times 10^7$ | $3.2 \times 10^{13}$ | $4.6 \times 10^{12}$ | $>4.0 \times 10^7$ | $1.2 \times 10^{13}$ |
| $R_s$ of exposed areas rinsed with water [Ω/square] | $1.1 \times 10^5$ | $2.7 \times 10^4$ | $3.0 \times 10^4$ | $1.13 \times 10^7$ | $1.5 \times 10^5$ | $2.1 \times 10^3$ | $1.0 \times 10^5$ |
| $R_s$ ratio of exposed areas to unexposed areas after rinsing with water | $5.6 \times 10^7$ | $>1.5 \times 10^3$ | $>1.3 \times 10^3$ | $2.8 \times 10^6$ | $3.1 \times 10^7$ | $>1.9 \times 10^4$ | $1.2 \times 10^8$ |
| Resolution [μm] | — | 6 | — | 6 | 10 | — | 6 |

Despite Samples LXVIII, LXIX, LXX, LXXII and LXXIII only having ADS-MONOMER 01 homopolymer in the underlayer and the PEDOT/PSS-containing outermost layer being conductivity-enhanced as a result of the presence of N-methyl-pyrrolidinone, moderate differential surface resistivities were observed with Samples LXIX, LXX and LXXIII and considerable differential surface resistivities with Samples LXVIII and LXXII. This shows that structuring of a PEDOT/PSS-containing outermost layer is possible with UV-exposure of resins comprising arylazosulphonate group in an adjacent layer. Samples LXXI and LXXIV with the ADS-MONOMER 01 homopolymer in both the underlayer and the PEDOT/PSS-containing outermost layer adjacent thereto exhibits considerable differential surface conductivities, whether or not the PEDOT/PSS-containing outermost layer is coated with the conductivity enhancing agent N-methyl-pyrrolidinone.

EXAMPLE 17

EXAMPLE 17, discloses the negative patterning performance of different layer configurations on Support nr. 1 and Support nr. 3. The support used and the compositions of the layers are given in Table 27. Layers 1 and 2 were both coated to thicknesses of 50 μm.

TABLE 27

| | SAMPLE | | | | | |
|---|---|---|---|---|---|---|
| | LXXV | LXXVI | LXXVII | LXXVIII | LXXIX | LXXX |
| Support nr. | 1 | 1 | 1 | 3 | 3 | 3 |
| LAYER 1 [g] | | | | | | |
| 15.9% sol. NDP14 in water/isopropanol (40/60 by vol.) | 0.63 | 0.63 | 0.63 | 0.63 | 0.63 | 0.63 |
| 2% aq. sol. ZONYL FSO 100 | 0.5 | 0.5 | 0.5 | 0.5 | 0.5 | 0.5 |
| deionized water | 48.87 | 48.87 | 48.87 | 48.87 | 48.87 | 48.87 |
| OUTERMOST LAYER 2 [g] | | | | | | |
| 1.2% aq. PEDOT/PSS disp. | 16.7 | 16.7 | 16.7 | 16.7 | 16.7 | 16.7 |
| 2% aq. sol. ZONYL FSO 100 | 0.5 | 0.5 | 0.5 | 0.5 | 0.5 | 0.5 |
| 2.5% aqueous $NH_4OH$ | 0.4 | 0.4 | 0.4 | 0.4 | 0.4 | 0.4 |
| Z6040 | 0.07 | — | — | 0.07 | — | — |
| 15.9% sol. NDP14 in water/isopropanol (40/60 by vol.) | — | 0.63 | 0.63 | — | 0.63 | 0.63 |
| N-methyl-pyrrolidinone | 2.5 | — | 2.5 | 2.5 | — | 2.5 |
| deionized water | 29.83 | 31.77 | 29.27 | 29.83 | 31.77 | 29.27 |
| pH | 3.4 | 3.4 | 3.4 | 3.4 | 3.4 | 3.4 |
| COVERAGE [mg/m$^2$] LAYER 1 | | | | | | |
| NDP14 | 100 | 100 | 100 | 100 | 100 | 100 |
| ZONYL FSO 100 | 10 | 10 | 10 | 10 | 10 | 10 |
| OUTERMOST LAYER 2 [mg/m$^2$] | | | | | | |
| PEDOT/PSS | 200 | 200 | 200 | 200 | 200 | 200 |
| 3-glycidoxypropyl-trimethoxysilane | 70 | — | — | 70 | — | — |
| NDP14 | — | 100 | 100 | — | 100 | 100 |
| ZONYL FSO 100 | 10 | 10 | 10 | 10 | 10 | 10 |

The samples were exposed through a mask on a PRINTON™ CDL 1502i UV contact exposure unit (from AGFA-GEVAERT N.V.) for 100 s at 4 mW/cm$^2$ (=exposure of 0.4 J/cm$^2$) and processed by rinsing with deionized water. No rubbing was for Samples LXXVI and LXXIX and soft rubbing was required for Samples LXXVII and LXXX. The surface resistivities of the non-exposed and exposed areas of the light-exposure differentiable element before and after rinsing with deionized water are given in Table 28.

Conductivity enhancement was then carried out on Samples LXXVI and LXXIX by dipping the developed materials in a 10% aqueous N-methyl-pyrrolidinone solution for 1 minute and then drying for 10 minutes at 50° C. The surface resistivities of the non-exposed and exposed areas after conductivity enhancement are given in Table 28.

and the PEDOT/PSS-containing outermost layer or just in the underlayer. Furthermore Samples LXXVI and LXXIX with NDP14 in both the underlayer and the PEDOT/PSS-containing outermost layers and with PEDOT/PSS-containing outermost layers coated with PEDOT/PSS-dispersions not containing a conductivity-enhancing agent N-methyl-pyrrolidinone exhibited very high $R_s$ ratios of exposed areas to unexposed areas of ca. $3\times10^8$ after conductivity upgrading with the conductivity enhancement agent N-methyl-pyrrolidinone.

This example showed that copolymers of an ADS-MONOMER were just as effective as light-sensitive components capable upon exposure of changing the removability of the exposed parts of the PEDOT/PSS-containing outermost layer relative to the unexposed parts of this outermost

TABLE 28

| | SAMPLE | | | | | |
|---|---|---|---|---|---|---|
| | LXXV | LXXVI | LXXVII | LXXVIII | LXXIX | LXXX |
| Support nr. | 1 | 1 | 1 | 3 | 3 | 3 |
| $R_s$ of non-exposed areas unrinsed with water [Ω/square] | $4.5 \times 10^3$ | $1.7 \times 10^7$ | $5.3 \times 10^3$ | $4.9 \times 10^3$ | $1.3 \times 10^7$ | $4.0 \times 10^3$ |
| $R_s$ of non-exposed areas rinsed with water [Ω/square] | $3.7 \times 10^5$ | $>4.0 \times 10^7$ | $6.3 \times 10^6$ | $1.2 \times 10^{13}$ | $>4.0 \times 10^7$ | $1.55 \times 10^{13}$ |
| $R_s$ of expoed areas rinsed with water [Ω/square] | $8.5 \times 10^3$ | $3.4 \times 10^6$ | $2.2 \times 10^4$ | $3.0 \times 10^4$ | $3.3 \times 10^6$ | $1.3 \times 10^4$ |
| $R_s$ ratio of exposed areas to unexposed areas after processing with water | 43.5 | >11.8 | 2.9 | $4.0 \times 10^8$ | >12.1 | $1.2 \times 10^9$ |
| $R_s$ (Ω/square) of large non-exposed areas after total processing including conductivity upgrading | — | $8.5 \times 10^{12}$ | — | — | $1.38 \times 10^{13}$ | — |
| $R_s$ (Ω/square) of exposed areas after exposure, processing and conductivity upgrading | — | $2.9 \times 10^4$ | — | — | $4.5 \times 10^4$ | — |
| $R_s$ ratio of exposed areas to unexposed areas after processing and conductivity upgrading | — | $2.9 \times 10^8$ | — | — | $3.1 \times 10^8$ | — |
| Optical resolution [μm] | — | 6 | 6 | — | 6 | 6 |

The results in Table 28 clearly show that for materials with outermost layers coated from PEDOT/PSS-dispersions containing N-methyl-pyrrolidinone, a conductivity enhancing agent, Support nr. 3, glow discharge-treated polyethylene terephthalate film, gave a much higher $R_s$ ratio of exposed areas to unexposed areas after processing than materials coated on Support nr. 1. For Samples LXXVI and LXXIX with NDP14, a ADS-MONOMER 01 hydroxyethyl methacrylate copolymer, in both the underlayer and the PEDOT/PSS-containing outermost layer and with the PEDOT/PS-containing outermost layers coated from PEDOT/PSS-dispersions not containing a conductivity-enhancing agent, this effect was negligible after conductivity enhancement with N-methyl-pyrrolidinone.

Materials coated on Support nr. 3 all showed very high $R_s$ ratios of exposed areas to unexposed areas of at least $4\times10^8$ for materials with outermost layers coated from PEDOT/PSS-dispersions containing N-methyl-pyrrolidinone whether NDP14, a ADS-MONOMER 01 hydroxyethyl methacrylate copolymer, was present in both the underlayer layer when incorporated in an adjacent layer to the PEDOT/PSS-containing outermost layer.

EXAMPLE 18

In EXAMPLE 18, different concentrations of BADS02, a negative working light-sensitive bis(aryldiazosulphonate) salt, were used in the PEDOT/PSS-containing outermost layer for patterning a polythiophene outermost layer. Support nr. 1 was coated with 40 mL/m$^2$ (40 μm wet thickness) of the coating dispersions given in Table 29.

TABLE 29

| | SAMPLE | | | | | | | |
|---|---|---|---|---|---|---|---|---|
| | LXXXI (COMP) | LXXXII | LXXXIII | LXXXIV | LXXXV | LXXXVI | LXXXVII | LXXXVIII |
| INGREDIENT [g] | | | | | | | | |
| 1.2% aq. PEDOT/PSS dispersion | 41.7 | 41.7 | 41.7 | 41.7 | 41.7 | 41.7 | 41.7 | 41.7 |
| 2% aq. solution of ZONYL ™ FSO 100 | 1 | 1 | 1 | 1 | 1 | 1 | 1 | 1 |
| N-methyl-pyrrolidinone | 5 | 5 | 5 | 5 | 5 | 5 | 5 | 5 |
| BADS02 | 0 | 0.025 | 0.0625 | 0.125 | — | 0.25 | 0.25 | 0.5 |
| 1% aq. sol. BADS02 | — | — | — | — | 21.8 | — | — | — |
| deionized water | 51.02 | 51.00 | 50.96 | 50.90 | 21.5 | 50.99 | 51.15 | 51.12 |
| 2.5% aqueous $NH_4OH$ | 1.28 | 1.28 | 1.28 | 1.28 | 9.0 | 1.06 | 0.9 | 0.68 |
| pH | 3.41 | 3.3 | 3.17 | 3.45 | 3.26 | 3.53 | 2.6–2.8 | 3.55 |
| COVERAGE [mg/m$^2$] | | | | | | | | |
| PEDOT/PSS | 200 | 200 | 200 | 200 | 200 | 200 | 200 | 200 |
| BADS02 | 0 | 10 | 25 | 50 | 87* | 100 | 100 | 200 |
| ZONYL ™ FSO 100 | 8 | 8 | 8 | 8 | 8 | 8 | 8 | 8 |

*$2.0 \times 10^{-4}$ mol/m$^2$

The samples were exposed through a mask on a PRINTON™ CDL 1502i UV contact exposure unit above the glass filter (from AGFA-GEVAERT N.V.) for 400 s at 4 mW/cm$^2$ (=exposure of 1.6 J/cm$^2$) and processed by rinsing with deionized water. However, almost no difference was observed in the surface resistivities whether exposure times of 100 s or 400 s were used, as long as subsequent rinsing with water was carried out. The degradation process appears to continue if the material is contacted with water.

The surface resistivities of the non-exposed and exposed areas of the light-exposure differentiable element before and after rinsing with water are given in Table 30.

surface resistivity ratios of exposed to unexposed areas, which vary with BADS02 concentration without removal of the non-exposed areas. The highest surface conductivity ratio of 10$^4$ was observed for 87 mg/m$^2$ BADS02 ($2.0 \times 10^{-4}$ mol/m$^2$).

When the light-exposure differentiable elements of Samples LXXXII to LXXXVIII were then rubbed softly water-moistened tissues, the non-exposed areas were removed thereby increasing the surface resistivity of the unexposed areas to ca. 10$^6$ Ω/square. Stronger rubbing increased the surface resistivity of the unexposed areas to 10$^{10}$ Ω/square.

TABLE 30

| | SAMPLE | | | | | | | |
|---|---|---|---|---|---|---|---|---|
| | LXXXI (COMP) | LXXXII | LXXXIII | LXXXIV | LXXXV | LXXXVI | LXXXVII | LXXXVIII |
| BADS02 [mg/m$^2$] | 0 | 10 | 25 | 50 | 87 | 100 | 100 | 200 |
| $R_s$ of exposed layer unrinsed with water [Ω/square] | $2.2 \times 10^3$ | $1.9 \times 10^4$ | $1.5 \times 10^5$ | $1.5 \times 10^6$ | $5.3 \times 10^6$ | $7.8 \times 10^6$ | $1.0 \times 10^7$ | $2.0 \times 10^7$ |
| $R_s$ of exposed areas rinsed with water [Ω/square] | $2.9 \times 10^3$ | $3.4 \times 10^4$ | $4.9 \times 10^5$ | $7.2 \times 10^6$ | $6.7 \times 10^7$ | $1.1 \times 10^8$ | $1.5 \times 10^8$ | $1.1 \times 10^8$ |
| $R_s$ of non-exposed areas unrinsed with $H_2O$ [Ω/square] | $2.1 \times 10^3$ | $2.5 \times 10^3$ | $3.3 \times 10^3$ | $5.9 \times 10^3$ | $6.2 \times 10^3$ | $1.2 \times 10^4$ | $1.3 \times 10^4$ | $6.5 \times 10^4$ |
| $R_s$ of non-exposed areas rinsing with water [Ω/square] | $2.7 \times 10^3$ | $3.8 \times 10^3$ | $5.1 \times 10^3$ | $1.1 \times 10^4$ | $6.2 \times 10^3$ | $2.1 \times 10^4$ | $1.8 \times 10^4$ | $1.4 \times 10^5$ |
| $R_s$ ratio of exposed areas to unexposed areas after rinsing with water | 1.1 | 8.95 | 96.1 | 654.5 | 10806 | 5238 | 8333 | 785.7 |

The results in Table 30 show differential surface resistivity between the exposed and unexposed areas of the surface of light-differentiable element containing BADS02 with

EXAMPLE 19

In EXAMPLE 19, BADS01, BADS02 and BADS03, negative working light-sensitive bis(aryldiazosulphonate)

salts, were used for patterning a polythiophene outermost layer. Samples LXXXIX to LCIII were prepared by coating Support nr. 1 with 40 mL/m² (40 μm wet thickness) of the coating dispersions given in Table 31 followed by drying at 50° C. for 5 minutes except in the case of dispersions containing diethylene glycol which were dried at 110° C. for 5 minutes.

TABLE 31

| | SAMPLE | | | | |
|---|---|---|---|---|---|
| | LXXXIX | XC | XCI | XCII | XCIII |
| INGEDIENT [g] | | | | | |
| 1,2% aq. PEDOT/PSS dispersion | 41.7 | 41.7 | 41.7 | 41.7 | 41.7 |
| 2% aq. sol. of ZONYL ™ FSO 100 | 1 | 1 | 1 | 1 | 1 |
| N-methyl-pyrrolidinone | 5 | — | 5 | — | 5 |
| diethylene glycol | — | — | — | 5 | — |
| BADS01 | 0.25 | — | — | — | — |
| BADS02 | — | 0.25 | 0.25 | 0.25 | — |
| 1% aq. solution of BADS03 | — | — | — | — | 25 |
| deionized water | 51.15 | 57.0 | 52.05 | 52.05 | 26.4 |
| 2.5% aqueous NH₄OH | 0.9 | — | — | — | 0.9 |
| pH | 2.6–2.8 | — | — | — | 2.31 |
| COVERAGE | | | | | |
| PEDOT/PSS [mg/m²] | 200 | 200 | 200 | 200 | 200 |
| BADS01 [mg/m²] | 100 | — | — | — | — |
| BADS02 [mg/m²] | — | 100 | 100 | 100 | — |
| BADS03 [mg/m²] | — | — | — | — | 100 |
| ZONYL ™ FSO 100 [mg/m²] | 8 | 8 | 8 | 8 | 8 |

The samples were exposed through a mask on a PRINTON™ CDL 1502i UV contact exposure unit above the glass filter (from AGFA-GEVAERT N.V.) for 400 s at 4 mW/cm² (=exposure of 1.6 J/cm²) and processed in a 2.5% aqueous NH₄OH solution and rinsed with deionized. The surface resistivities of the non-exposed and exposed areas of the light-exposure differentiable element before and after rinsing with water and drying at 50° C. for 4 minutes are given in Table 32.

The results in Table 32 show differential surface resistivity between the exposed and unexposed areas of the surface of light-differentiable element containing BAD01, BADS02 and BADS03 with surface resistivity ratios of exposed to unexposed areas. The highest surface conductivity ratio of 16,666 was observed for BADS02.

When the light-exposure differentiable elements of Samples LXXXIX to XCIII were then rubbed softly water-moistened tissues, the non-exposed areas were removed thereby increasing the surface resistivity of the unexposed areas to ca. $10^6$ Ω/square. Stronger rubbing increased the surface resistivity of the unexposed areas to $10^{10}$ Ω/square.

TABLE 32

| | SAMPLE | | | | |
|---|---|---|---|---|---|
| | LXXXIX | XC | XCI | XCII | XCIII |
| $R_s$ of exposed layer untreated with water [Ω/square] | 1.6 × 10⁵ | 8.6 × 10⁶ | 4.6 × 10⁵ | 2.1 × 10⁵ | 3.7 × 10⁵ |
| $R_s$ of exposed layer rinsed with water [Ω/square] | 6.1 × 10⁵ | 2.5 × 10¹⁴* | 2.0 × 10⁸ | 4.6 × 10⁶ | 2.6 × 10⁶ |
| $R_s$ of non-exposed layer unrinsed with water [Ω/square] | 1.2 × 10⁴ | 9.2 × 10⁵ | 5.3 × 10³ | 2.9 × 10⁵ | 1.4 × 10⁴ |

TABLE 32-continued

| | SAMPLE | | | | |
|---|---|---|---|---|---|
| | LXXXIX | XC | XCI | XCII | XCIII |
| $R_s$ of non-exposed layer rinsed with water [Ω/square] | 1.6 × 10⁴ | 2.5 × 10¹⁴* | 1.2 × 10⁴ | 2.1 × 10⁶ | 2.3 × 10⁴ |
| $R_s$ ratio of exposed layer to unexposed layer after rinsing with water | 38 | 1.0 | 16,666 | 2.2 | 113 |

*layer is completely removed when surface resistivity 1s $10^{14}$ Ω/square

The present invention may include any feature or combination of features disclosed herein either implicitly or explicitly or any generalisation thereof irrespective of whether it relates to the presently claimed invention. In view of the foregoing description it will be evident to a person skilled in the art that various modifications may be made within the scope of the invention.

What is claimed is:

1. A material for making an electroconductive pattern, said material comprising a support and a light-exposure differentiable element, characterized in that said light-exposure differentiable element comprises an outermost layer containing a polyanion and a polymer or copolymer of a substituted or unsubstituted thiophene, and optionally a second layer contiguous with said outermost layer; and wherein said outermost layer and/or said optional second layer contains a light-sensitive component capable upon exposure of changing the removability of the exposed parts of said outermost layer relative to the unexposed parts of said outermost layer.

2. Material according to claim 1, wherein said polymer of a substituted or unsubstituted thiophene corresponds to formula (II):

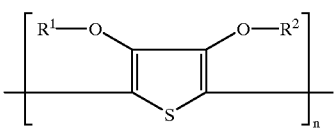

in which n is larger than 1 and each of $R^1$ and $R^2$ independently represent hydrogen or an optionally substituted $C_{1-4}$ alkyl group or together represent an optionally substituted $C_{1-4}$ alkylene group or an optionally substituted cycloalkylene group, preferably an ethylene group, an optionally alkyl-substituted methylene group, an optionally $C_{1-12}$ alkyl- or phenyl-substituted ethylene group, a 1,3-propylene group or a 1,2-cyclohexylene group.

3. Material according to claim 1, wherein said polyanion is poly(styrene sulphonate).

4. Material according to claim 1, wherein said outermost layer has a surface resistivity lower than $10^6$ Ω/square.

5. Material according to claim 1, wherein said light-sensitive component capable upon exposure of changing the removability of the exposed parts of said outermost layer relative to the unexposed parts of said outermost layer is a multidiazonium salt or a resin comprising a diazonium salt which reduces the removability of exposed parts of said outermost layer.

6. Material according to claim 1, wherein said light-sensitive component capable upon exposure of changing the removability of the exposed parts of said outermost layer relative to the unexposed parts of said outermost layer is a bis(aryldiazosulphonate) salt, a tris(aryldiazosulphonate) salt or a tetrakis(aryldiazosulphonate) salt which reduces the removability of exposed parts of said outermost layer.

7. Material according to claim 6, wherein said bis (aryldiazosulphonate) salt is selected from the group consisting of

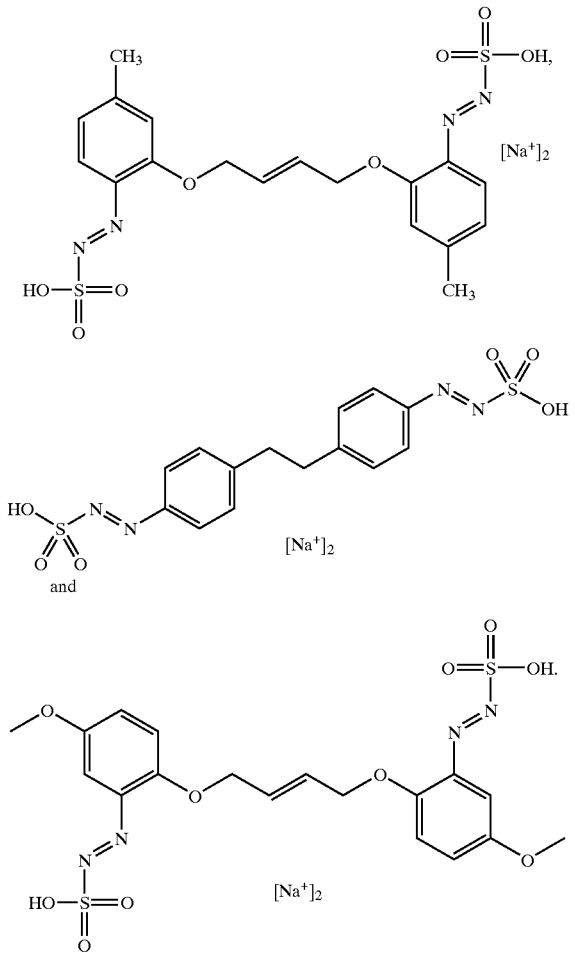

and

8. Material according to claim 1, wherein said light-sensitive component capable upon exposure of changing the removability of the exposed parts of said outermost layer relative to the unexposed parts of said outermost layer is a bis(aryldiazosulphonate) salt, which reduces the removability of exposed parts of said outermost layer, according to formula (I):

where Ar is a substituted or unsubstituted aryl group, L is a divalent linking group, and M is a cation.

9. Material according to claim 1, wherein said light-sensitive component capable upon exposure of changing the removability of the exposed parts of said outermost layer relative to the unexposed parts of said outermost layer is a polymer or copolymer of an aryldiazosulphonate which reduces the removability of exposed parts of said outermost layer.

10. Material according to claim 9, wherein in said light-exposure differentiable element the weight ratio of said polymer or copolymer of an aryldiazosulphonate to said polymer or copolymer of a substituted or unsubstituted thiophene is between 10:200 and 400:200.

11. Material according to claim 1, wherein said light-sensitive component capable upon exposure of changing the removability of the exposed parts of said outermost layer relative to the unexposed parts of said outermost layer is a quinonediazide compound which increases the removability of exposed parts of said outermost layer.

12. Material according to claim 1, wherein said support is treated with a corona discharge or a glow discharge.

13. Method of making an electroconductive pattern on a support comprising the steps of:
   providing a material for making an electroconductive pattern, said material comprising a support and a light-exposure differentiable element, wherein said light-exposure differentiable element comprises an outermost layer containing a polyanion and a polymer or copolymer of a substituted or unsubstituted thiophene, and optionally a second layer contiguous with said outermost layer; and wherein said outermost layer and/or said optional second layer contains a light-sensitive component capable upon exposure of changing the removability of the exposed parts of said outermost layer relative to the unexposed parts of said outermost layer;
   image-wise exposing said material thereby obtaining a differentiation of the removability, optionally with a developer, of said exposed and said non-exposed areas of said outermost layer;
   processing said material, optionally with said developer, thereby removing areas of said outermost layer; and
   optionally treating said material to increase the electroconductivity of said non-removed areas of said outermost layer.

14. Method according to claim 13, wherein said non-removed areas of said outermost layer have a surface resistivity lower than $10^6$ Ω/square.

15. Method according to claim 13, wherein said non-removed areas of said outermost layer have a surface resistivity lower than $10^4$ Ω/square.

16. Method of making an electroconductive pattern on a support without a removal step comprising the steps of:
   providing a material for making an electroconductive pattern, said material comprising a support and a light-exposure differentiable element, characterized in that said light-exposure differentiable element comprises an outermost layer containing a polyanion and a polymer or copolymer of a substituted or unsubstituted thiophene having a surface resistivity lower than $10^6$ Ω/square, and optionally a second layer contiguous with said outermost layer; and wherein said outermost layer and/or said optional second layer contains an aryl diazosulfonate according to formula (I):

where Ar is a substituted or unsubstituted aryl group, L is a divalent linking group, and M is a cation; capable upon exposure of changing the removability of the exposed parts of said outermost layer relative to the unexposed parts of said outermost layer; and
   image-wise exposing the material thereby obtaining reduction in the conductivity of the exposed areas relative to non-exposed areas, optionally with a developer.

17. Method of making an electroconductive pattern on a support without a removal step according to claim 16, wherein said bis(aryldiazosulfonate) compound according to formula (I) is selected from the group consisting of

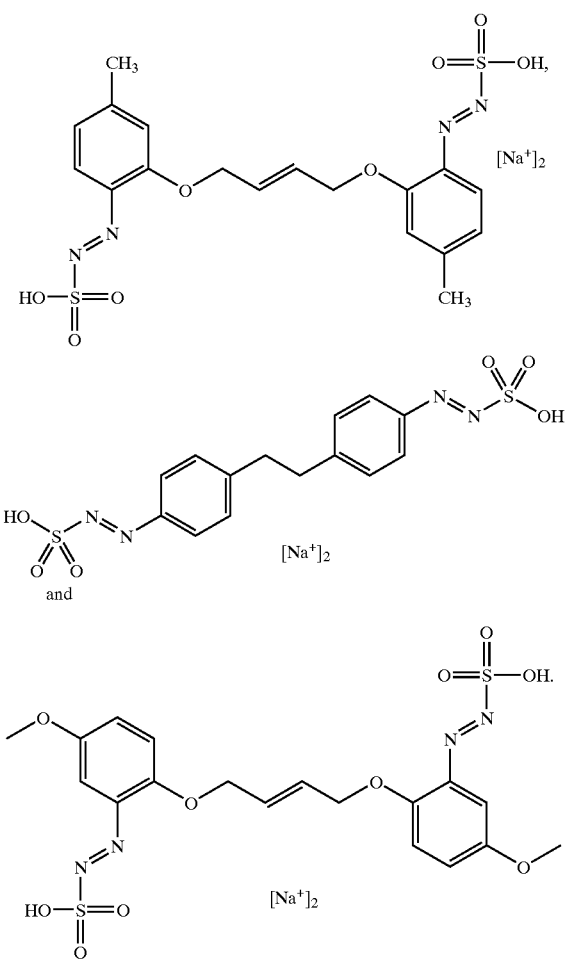

18. A material for making an electroconductive pattern, said material comprising a support and a light-exposure differentiable element, characterized in that said light-exposure differentiable element comprises an outermost layer containing a polyanion and a polymer or copolymer of a substituted or unsubstituted thiophene, and optionally a second layer contiguous with said outermost layer; and wherein said outermost layer and/or said optional second layer contains a light-sensitive component capable upon exposure of changing the removability of the exposed parts of said outermost layer relative to the unexposed parts of said outermost layer, said light-sensitive compound selected from the group consisting of a multidiazonium salt, a resin comprising a diazonium salt and a quinonediazide compound.

19. Method of making an electroconductive pattern on a support comprising the steps of:

providing a material for making an electroconductive pattern, said material comprising a support and a light-exposure differentiable element, wherein said light-exposure differentiable element comprises an outermost layer containing a polyanion and a polymer or copolymer of a substituted or unsubstituted thiophene, and optionally a second layer contiguous with said outermost layer; and wherein said outermost layer and/or said optional second layer contains a light-sensitive component capable upon exposure of changing the removability of the exposed parts of said outermost layer relative to the unexposed parts of said outermost layer, said light-sensitive compound selected from the group consisting of a multidiazonium salt, a resin comprising a diazonium salt and a quinonediazide compound;

image-wise exposing said material thereby obtaining a differentiation of the removability, optionally with a developer, of said exposed and said non-exposed areas of said outermost layer;

processing said material, optionally with said developer, thereby removing areas of said outermost layer; and optionally treating said material to increase the electroconductivity of said non-removed areas of said outermost layer.

\* \* \* \* \*

UNITED STATES PATENT AND TRADEMARK OFFICE
CERTIFICATE OF CORRECTION

PATENT NO. : 6,638,680 B2
DATED : October 28, 2003
INVENTOR(S) : Lamonte et al.

It is certified that error appears in the above-identified patent and that said Letters Patent is hereby corrected as shown below:

Title page,
Item [75], Inventors, add the following names, -- Lambertus Groenendaal and Hubertus Ven Aert --.

Signed and Sealed this

Fourth Day of January, 2005

JON W. DUDAS
*Director of the United States Patent and Trademark Office*

UNITED STATES PATENT AND TRADEMARK OFFICE
CERTIFICATE OF CORRECTION

PATENT NO. : 6,638,680 B2
DATED : October 28, 2003
INVENTOR(S) : Lamotte et al.

It is certified that error appears in the above-identified patent and that said Letters Patent is hereby corrected as shown below:

<u>Title page,</u>
Item [75], Inventors, add the following names, -- Lambertus Groenendaal and Hubertus Van Aert --.

This certificate supersedes Certificate of Correction issued January 4, 2005.

Signed and Sealed this

Tenth Day of May, 2005

JON W. DUDAS
*Director of the United States Patent and Trademark Office*